US012602890B2

(12) United States Patent
Hao et al.

(10) Patent No.: US 12,602,890 B2
(45) Date of Patent: Apr. 14, 2026

(54) NEURAL VECTOR FIELDS FOR 3D SHAPE GENERATION

(71) Applicant: NVIDIA Corporation, Santa Clara, CA (US)

(72) Inventors: Zekun Hao, New York, NY (US); Ming-Yu Liu, San Jose, CA (US); Arun Mohanray Mallya, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 332 days.

(21) Appl. No.: 18/361,587

(22) Filed: Jul. 28, 2023

(65) Prior Publication Data

US 2024/0193887 A1      Jun. 13, 2024

Related U.S. Application Data

(60) Provisional application No. 63/431,849, filed on Dec. 12, 2022.

(51) Int. Cl.
*G06T 19/20* (2011.01)
*G06F 30/10* (2020.01)

(52) U.S. Cl.
CPC .............. *G06T 19/20* (2013.01); *G06F 30/10* (2020.01); *G06T 2210/56* (2013.01); *G06T 2219/2021* (2013.01)

(58) Field of Classification Search
None
See application file for complete search history.

(56) References Cited

U.S. PATENT DOCUMENTS

2018/0218473 A1* 8/2018 Hoppert ............. G06F 9/45529
2018/0314917 A1* 11/2018 Mehr ...................... G06F 30/00
2021/0149022 A1* 5/2021 Kehl ...................... G06V 20/56
(Continued)

OTHER PUBLICATIONS

Rella et al. "Neural Vector Fields for Implicit Surface Representation and Inference." arXiv e-prints (2022): arXiv-2204. (Year: 2022).*

(Continued)

*Primary Examiner* — Daniel F Hajnik
*Assistant Examiner* — Jed-Justin Imperial
(74) *Attorney, Agent, or Firm* — Leydig, Voit & Mayer, Ltd.

(57)      ABSTRACT

Synthesis of high-quality 3D shapes with smooth surfaces has various creative and practical use cases, such as 3D content creation and CAD modeling. A vector field decoder neural network is trained to predict a generative vector field (GVF) representation of a 3D shape from a latent representation (latent code or feature volume) of the 3D shape. The GVF representation is agnostic to surface orientation, all dimensions of the vector field vary smoothly, the GVF can represent both watertight and non-watertight 3D shapes, and there is a one-to-one mapping between a predicted 3D shape and the ground truth 3D shape (i.e., the mapping is bijective). The vector field decoder can synthesize 3D shapes in multiple categories and can also synthesize 3D shapes for objects that were not included in the training dataset. In other words, the vector field decoder is also capable of zero-shot generation.

21 Claims, 13 Drawing Sheets

300

Receive a latent representation corresponding to a 3D shape
310

Apply learned parameters to the latent representation, by an implicit decoder neural network, to predict a GVF representation of the 3D shape, where the GVF maps points in 3D space to vectors, such that a closest point on a surface of the 3D shape is intersected by moving from a point of the points along a vector that is mapped to the point
320

(56)     References Cited

U.S. PATENT DOCUMENTS

2023/0169662 A1*  6/2023  Cao .......................... G06T 7/12
                                                    382/133

OTHER PUBLICATIONS

Chen, W., et al., "3PSDF: Three-Pole Signed Distance Function for Learning Surfaces with Arbitrary Topologies," in CVPR, 2022.

Chibane, J., et al., "Neural unsigned distance fields for implicit function learning," in NeurIPS, 2020.

Mello Rella, E., et al., "Neural vector fields for surface representation and inference," arXiv preprint arXiv:2204.06552, 2022.

Venkatesh, R., et al., "Deep implicit surface point prediction networks," in ICCV, 2021.

Venkatesh, R., et al., "DUDE: Deep unsigned distance embeddings for hi-fidelity representation of complex 3D surfaces," arXiv preprint arXiv:2011.02570, 2020.

Sangi, A., et al., "TextCraft: Zero-shot generation of high-fidelity and diverse shapes from text," arXiv preprint arXiv:2211.01427, 2022.

Sangi, A., et al., "CLIP-Forge: Towards zero-shot text-to-shape generation," in CVPR, 2022.

Zeng, X., et al., "LION: Latent point diffusion models for 3D shape generation," arXiv preprint arXiv:2210.06978, 2022.

Zheng, X., et al., SDF-Style-GAN: Implicit SDF-Based StyleGAN for 3D Shape Generation, in Computer Graphics Forum, 2022.

Hui, K.H., et al., "Neural wavelet-domain diffusion for 3D shape generation," arXiv preprint arXiv:2209.08725, 2022.

Ibing, M., et al., "3D shape generation with grid-based implicit functions," in CVPR, 2021.

Liu, Z., et al., "Towards implicit text-guided 3D shape generation," in CVPR, 2022.

Luo, S., et al., "Diffusion probabilistic models for 3D point cloud generation," in CVPR, 2021.

Mittal, P., et al., "AutoSDF: Shape priors for 3D completion, reconstruction and generation," in CVPR, 2022.

Chang, A., et al., "ShapeNet: An information-rich 3D model repository," arXiv preprint arXiv:1512.03012, 2015.

Chen, et al., "Text2shape: Generating shapes from natural language by learning joint embeddings," arXiv preprint arXiv:1803.08495, 2018.

Collins, J., et al., "ABO: Dataset and benchmarks for real-world 3D object understanding," in CVPR, 2022.

Dhariwal, P., et al.,, "Diffusion models beat gans on image synthesis," Advances in Neural Information Processing Systems, 34:8780-8794, 2021.

He, K., et al., "Delving deep into rectifiers: Surpassing human-level performance on imagenet classification," in ICCV, 2015.

Karras, T., "Maximizing parallelism in the construction of BVHs, octrees, and k-d trees," in ACM TOG, 2012.

Karras, T., et al., "Fast parallel construction of high-quality bounding volume hierarchies," in HPG, 2013.

Karras, T.,, et al., "Elucidating the design space of diffusion-based generative models," in NeurIPS, 2022.

Liu, N., et al., "Compositional visual generation with composable diffusion models," arXiv preprint arXiv:2206.01714, 2022.

Radford, A., et al., "Learning transferable visual models from natural language supervision," in ICML, 2021.

Rombach, R., et al., "High-resolution image synthesis with latent diffusion models," in CVPR, 2022.

Savva, M., et al., "Semantically-enriched 3D models for common-sense knowledge," in CVPRW, 2015.

Shi, W., et al., "Real-time single image and video super-resolution using an efficient sub-pixel convolutional and neural network," in CVPR, 2016.

* cited by examiner

140

146

150

156

145

155

151

161

160

SDF     VF     UDF

Receive a latent representation
corresponding to a 3D shape
310

Apply learned parameters to the latent
representation, by an implicit decoder
neural network, to predict a GVF
representation of the 3D shape, where the
GVF maps points in 3D space to vectors,
such that a closest point on a surface of
the 3D shape is intersected by moving
from a point of the points along a vector
that is mapped to the point
320

*Fig. 3A*

GVF 3D shape
330

GVF 3D shape
335

GVF 3D shape
340

GVF 3D shape
345

GVF 3D shape
350

GVF 3D shape
355

GVF 3D shape
360

GVF 3D shape
365

NEURAL VECTOR FIELDS FOR 3D SHAPE GENERATION

CLAIM OF PRIORITY

This application claims the benefit of U.S. Provisional Application No. 63/431,849 titled "3D Object Generation Using Neural Vector Fields," filed Dec. 12, 2022, the entire contents of which is incorporated herein by reference.

BACKGROUND

Synthesis of high-quality three-dimensional (3D) shapes with smooth surfaces has various creative and practical use cases, such as 3D content creation and computer aided design (CAD) modeling. Several conventional 3D shape representations have been developed that provide a compact definition of a 3D shape, compared with the popular 3D surface mesh representation. The purpose of the compact definition is to provide an efficient and accurate representation for a 3D shape synthesized by a generative model. The synthesized 3D shape may be converted into an accurate mesh representation for use by 3D content and CAD tools.

3PSDF (3P signed distance field) and UDF (unsigned distance field) are conventional 3D shape representations used by generative models for reconstruction of 3D shapes. A signed distance field (SDF) is a scalar field that models the distance from an arbitrary point to the closest point on a surface and a sign of the scalar indicates whether the point is inside or outside of the surface. An SDF models a shape as a surface and cannot model non-watertight shapes. Moreover, determining whether a point is inside or outside a shape modeled as an SDF is expensive, unreliable, and often requires offline pre-computation. Such shortcomings have made it difficult to scale to large datasets. 3PSDF is variation of SDF that can represent non-watertight surfaces but requires surface normal orientations for mesh faces and when available, the surface normal vectors are often inaccurate.

A voxel 3D shape representation requires large amounts of memory unless constrained to low-resolution such as $32^3$ or $64^3$ and are therefore not suitable for modeling smooth and detailed surfaces. A point cloud representation may be processed efficiently, but conversion from point cloud back to 3D surface is lossy and non-trivial.

Conventional generative models used to reconstruct 3D shapes are trained using the mesh representations of the 3D shapes. Mesh representations for training that are constructed by artists may not be watertight, and often contain complex topology or open surfaces. Because the available meshes are not watertight and may contain other irregularities, the meshes often require preprocessing to be converted into the 3PSDF or UDF representation for a 3D shape. The preprocessing is computationally intensive and also consumes additional storage. The preprocessing may also alter the geometry of the 3D shapes. There is a need for addressing these issues and/or other issues associated with the prior art.

SUMMARY

Embodiments of the present disclosure relate to using neural vector fields for 3D shape generation. Systems and methods are disclosed that train and use a vector field decoder neural network to predict a generative vector field (GVF) representation of a 3D shape. A vector field maps an arbitrary point in space to a vector, so that the closest point on the surface of a 3D shape can be reached by moving from the point along the vector. Similar to conventional representations, the GVF representation may be easily converted into a mesh representation for use by 3D content and CAD tools.

In contrast to conventional generative models, such as those described above, a vector field decoder neural network is trained to predict a GVF representation of a 3D shape. Latent representations (latent codes or feature volumes) for a 3D shape are processed by the vector field decoder that is trained to predict GVF representations of 3D shapes without preprocessing the ground truth mesh representations of the 3D shapes. Furthermore, the GVF representation is agnostic to surface orientation, all dimensions of the vector field vary smoothly, the GVF can represent both watertight and non-watertight 3D shapes, and there is a one-to-one mapping between a predicted 3D shape and the ground truth 3D shape (i.e., the mapping is bijective). Rather than being limited to synthesizing 3D shapes of a single category, as many conventional generative models are, the vector field decoder can synthesize 3D shapes in multiple categories. Finally, the vector field decoder can also synthesize 3D shapes for objects that were not included in the training dataset. In other words, the vector field decoder is also capable of zero-shot generation.

In an embodiment, a method of synthesizing a 3D shape includes receiving a latent representation corresponding to the 3D shape and applying learned parameters to the latent representation by an implicit decoder neural network to predict a generative vector field representation of the 3D shape, where the generative vector field maps points in 3D space to vectors, such that a closest point on a surface of the 3D shape is intersected by moving from a point of the points along a vector that is mapped to the point. In an embodiment, the latent representation comprises a latent code (a single feature vector without spatial dimension) or a feature grid (a grid of features with three spatial dimensions).

BRIEF DESCRIPTION OF THE DRAWINGS

The present systems and methods for 3D shape generation using neural vector fields are described in detail below with reference to the attached drawing figures, wherein:

FIG. 3A illustrates a flowchart of a method for synthesizing a 3D shape, in accordance with an embodiment.

DETAILED DESCRIPTION

Systems and methods are disclosed related to 3D shape generation using neural vector fields. Synthesis of high-quality 3D shapes with smooth surfaces has various creative and practical use cases, such as 3D content creation and CAD modeling. A vector field decoder neural network is trained to predict a generative vector field (GVF) representation of a 3D shape from a latent representation (latent code or feature volume) of the 3D shape. The GVF representation is agnostic to surface orientation, all dimensions of the vector field vary smoothly, the GVF can represent both watertight and non-watertight 3D shapes, and there is a one-to-one mapping between a predicted 3D shape and the ground truth 3D shape (i.e., the mapping is bijective). The vector field decoder can synthesize 3D shapes in multiple categories and can also synthesize 3D shapes for objects that were not included in the training dataset. In other words, the vector field decoder is also capable of zero-shot generation.

Figure 1A:
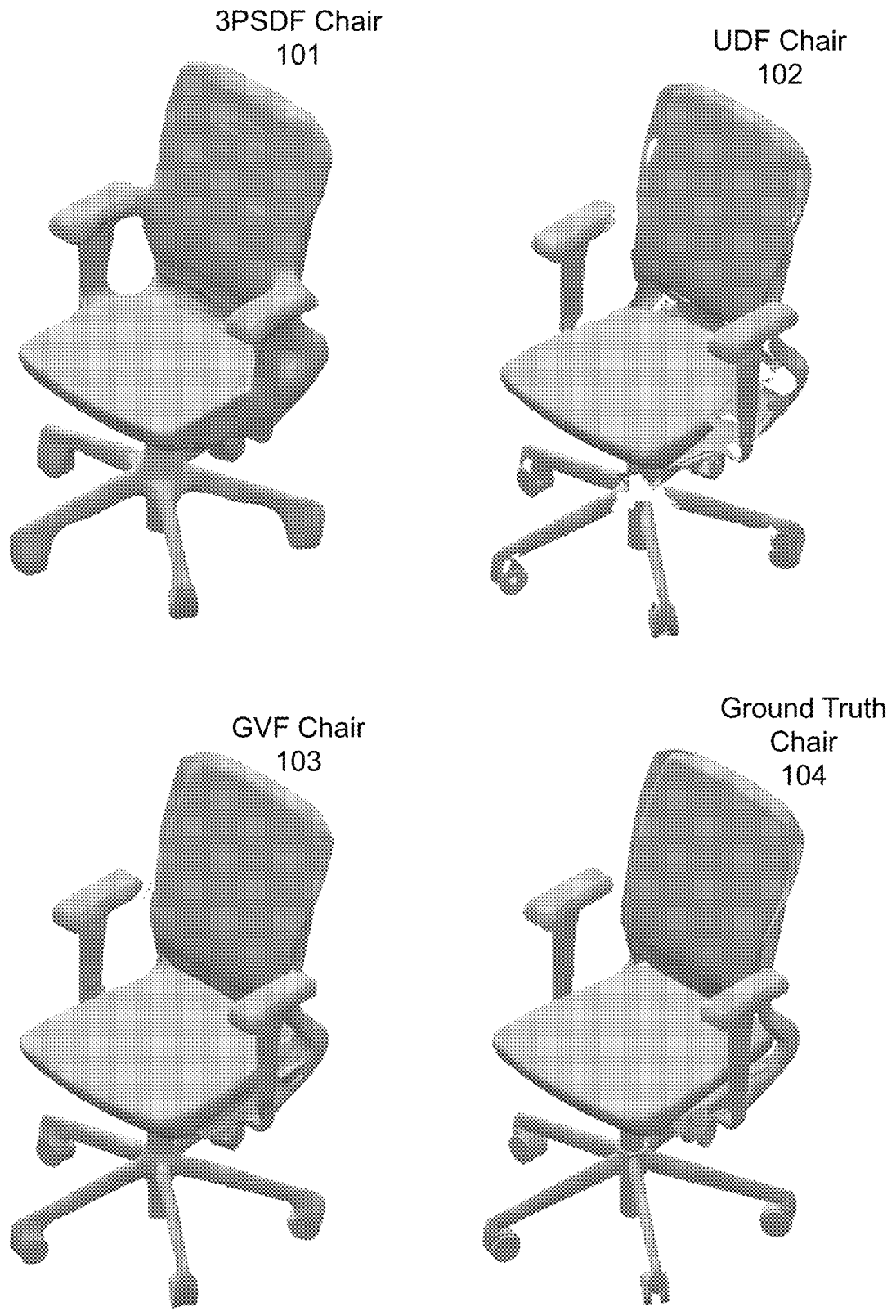
FIG. 1A illustrates synthesized 3D shapes, in accordance with an embodiment.

FIG. 1A illustrates synthesized 3D shapes, in accordance with an embodiment. Generative models reconstruct a 3D shape of a chair in the 3PSDF, UDF, and generative vector field (GVF) representations. A ground truth chair 104 is the goal shape to be generated. An 3PSDF chair 101 is generated using the 3PSDF representation and is lacking some fine details, particularly for the arms and base. A UDF chair 102 is generated using the UDF representation and the generated 3D shape contains holes. A GVF chair 103 is generated using the GVF representation and closely matches the ground truth chair 104. The GVF chair 103 has fewer artifacts compared with the 3PSDF chair 101 and the UDF chair 102.

Given a surface $S \subset \mathbb{R}^{3\,3}$, a vector field VF(p) is defined, which is a function of query point $p \in \mathbb{R}^{3\,3}$, as $$VF(p) = \arg\min_{p_s \in S} \|p - p_s\|_2 - p. \qquad \text{Eq. (1)}$$

Intuitively, an arbitrary point in space is mapped to a vector, so that the closest point on the surface can be reached by moving the point along the vector. VF has many useful properties. For example, the norm of the VF is immediately an unsigned distance field, $$UDF(p) = \|VF(p)\|_2. \qquad \text{Eq. (2)}$$

The tools available for conventional shape representations, such as surface rendering algorithms, can be applied to VF directly. Moreover, VF has the interesting property of having vectors on both sides of a surface pointing towards opposite directions when the vectors are close to the surface, reaching zero as the vectors approach the surface.

Figures 1B, 1C:
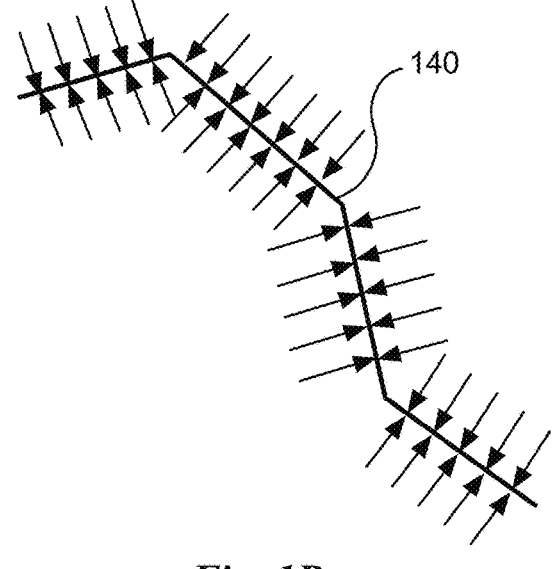
FIG. 1B illustrates a surface defined by a vector field (VF), in accordance with an embodiment.
FIG. 1C illustrates a comparison of SDF, VF, and UDF surface recovery from off-surface training samples, in accordance with an embodiment.

FIG. 1B illustrates a surface 140 defined by a vector field, in accordance with an embodiment. The vector field defines the open surface 140 unambiguously. There is a one-to-one (bijective) mapping between a shape and its corresponding vector field representation. 3PSDF does not represent identical surface uniquely, while a UDF does not define surface at a smooth region. Unlike 3PSDF, for each shape, there is only one possible VF configuration, which is only dependent on the surface geometry. Th one-to-one mapping provides a stable and unambiguous training target for a neural network, such as the vector field decoder neural network, leading to good fidelity on generative tasks.

By learning to perceptually compress VFs with a vector field decoder, a latent space is obtained. The vector field decoder evaluates the vector field for sample points to produce complex, open-surfaced 3D shapes. In the context of the following description, a vector field used in a generative capacity are referred to as a generative vector fields (GVF) or a neural vector fields (NVF).

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

A shape generation framework includes two stages, where a first stage encoder-decoder model produces the latent representation and the second stage latent generative model synthesizes the 3D shape representation. In an embodiment, the encoder-decoder model aims at converting an intractable 3D surface to a latent representation that is more amenable to generative modeling, such as a latent vector or a feature grid. The latent representation allows a wide range of second stage latent generative models to be used, generating the latent representation directly, circumventing the need for special frameworks.

An ideal first stage encoder-decoder model should be able to produce shapes with high quality, as it sets the upper bound for the full generation pipeline. Moreover, the encoder-decoder model should be able to pack the 3D surface compactly and robustly into the latent space in order to reduce the burden on the second stage latent generative model. As the two stages are trained separately, it is inevitable that the first stage model will receive latent embeddings never encountered during training, and the encoder-decoder model should still produce reasonable results. Therefore, the encoder-decoder model should be designed with proper inductive biases that favor generalization.

Two particularly desirable properties for a 3D shape generation system are to have a one-to-one mapping between a shape and its representation and for the representation to be smooth near the surface area. The one-to-one mapping not only provides a stable training target, but also allows efficient, non-redundant encoding of similar shapes or parts. At the same time, a smooth representation ensures that the representation is easier for a neural network to represent, resulting in a more robust model. Further, the smooth representation allows the surface to be easily inferred from off-surface training samples, making the training more efficient. Among all the open surface representations, vector field is the only one that also satisfies the two properties.

FIG. 1C illustrates a comparison of SDF, VF, and UDF surface recovery from off-surface training samples, in accordance with an embodiment. Locations of the off-surface samples are marked with circles. Ground truth representations of the surfaces are denoted with dashed lines. A surface 145 is reconstructed by a generative model in the SDF representation and the SDF representation correctly recovers a ground truth surface 146 from training samples that are far from the ground truth surface 146. Surfaces 150 and 155 are reconstructed by a generative model in the VF representation and the VF representation correctly recovers ground truth surfaces 151 and 156, respectively, from training samples that are far from each ground truth surface. In contrast, a surface 160 is reconstructed by a generative model in the UDF representation and the UDF representation is unable to recover the ground truth surface 161 given only off-surface samples, which can result in a lower training efficiency.

Figure 2A:
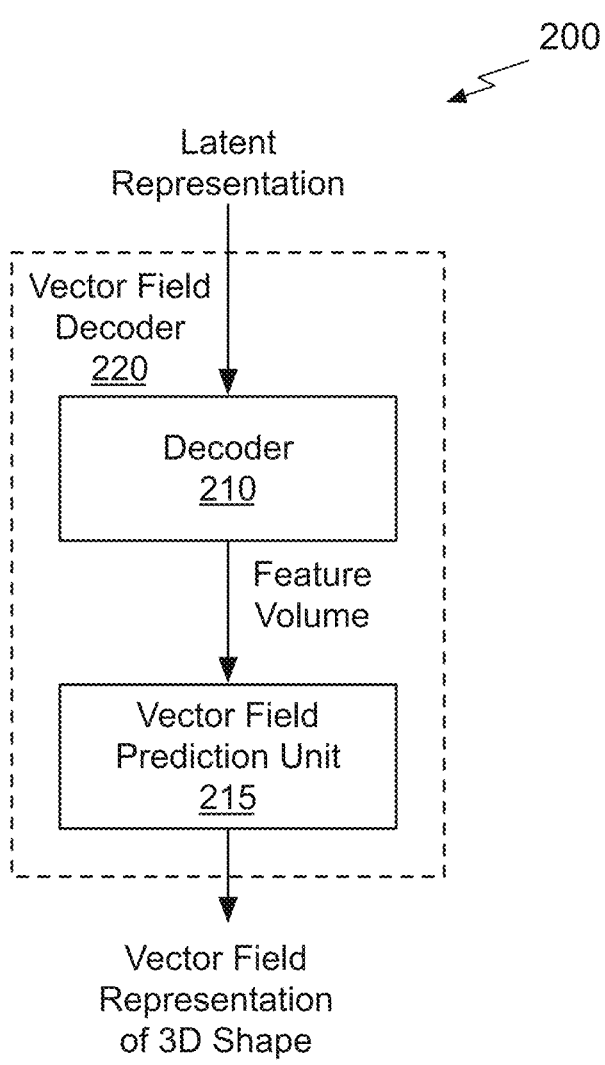
FIG. 2A illustrates a block diagram of an example 3D shape synthesis system comprising a vector field decoder suitable for use in implementing some embodiments of the present disclosure.

FIG. 2A illustrates a block diagram of an example 3D shape synthesis system 200 comprising a vector field decoder suitable for use in implementing some embodiments of the present disclosure. The 3D shape synthesis system 200 comprises a vector field decoder 220. The vector field decoder 220 comprises a decoder 210 and a vector field prediction unit 215. In an embodiment, an encoder is combined with the 3D shape synthesis system 200 to encode the 3D shapes into a low-dimensional latent space for input to the vector field decoder 220.

It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the 3D shape synthesis system 200 is within the scope and spirit of embodiments of the present disclosure.

The 3D shape synthesis system 200 receives a latent representation corresponding to the 3D shape and generates a vector field representation of a 3D shape. The vector field decoder 220 applies learned parameters to the latent representation to predict a GVF representation of the 3D shape. The GVF maps points in 3D space to vectors, such that a closest point on a surface of the 3D shape is intersected by moving from a point of the points along a vector that is mapped to the point. In an embodiment, the latent representation comprises a latent code (a single feature vector without spatial dimension) or a feature grid (a grid of features with three spatial dimensions).

The decoder 210 is trained to process a 3D shape latent code to produce a feature volume, e.g., feature grid. In an embodiment, the decoder 210 comprises a 3D convolutional neural network (CNN) that decodes the latent representation to produce a low-resolution feature volume. In an embodiment, the vector field prediction unit 215 comprises an implicit decoder neural network that first performs a grid interpolation operation on the feature volume to increase the resolution. In an embodiment, the implicit decoder neural network includes a multilayer perceptron (MLP) that processes the higher resolution feature volume to predict the vector field at sub-voxel resolution. The two-stage vector field decoder 220 not only allows theoretically infinite output resolution, but also provides a means of amortizing the time spent on inference-once the feature volume is generated, the feature volume can be cached and reused so that subsequent VF queries only need to evaluate the lightweight MLP.

Figure 2B:
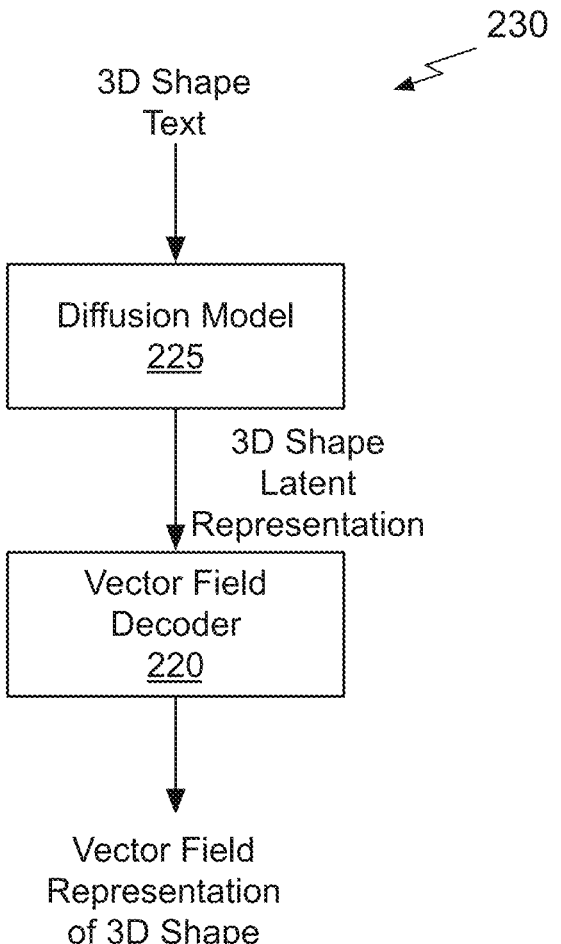
FIG. 2B illustrates a block diagram of an example text to 3D shape synthesis system suitable for use in implementing some embodiments of the present disclosure.

FIG. 2B illustrates a block diagram of an example text to 3D shape synthesis system 230 suitable for use in implementing some embodiments of the present disclosure. In an embodiment, as shown, the 3D shape synthesis system 200, implemented as the vector field decoder 220, is combined with a diffusion model 225 that maps input text to corresponding 3D shape latent representations for input to the vector field decoder 220. The combination of diffusion model 225 and the vector field decoder 220 implements a text to 3D shape generator capable of synthesizing shapes tailored to user-provided language-based guidance.

In an embodiment, the vector field decoder 220 is combined with an encoder to implement a vector quantized-variational autoencoder (VQ-VAE) for encoding vector fields and reconstruct shapes. Training may be performed in two phases, with the vector field decoder 220 and the encoder being trained in the first phase. In the second stage, the learned parameters used by the vector field decoder 220 and encoder are not updated (are frozen) and, the diffusion model 225 is trained to map input text to corresponding 3D shape latent representations. Parameters used by the diffusion model 225 are learned during the second stage. The two-stage training produces a vector field decoder 220 and a diffusion model 225 that are able to synthesize high-quality 3D shapes with open surfaces and generalizes to zero-shot synthesis.

Figure 2C:
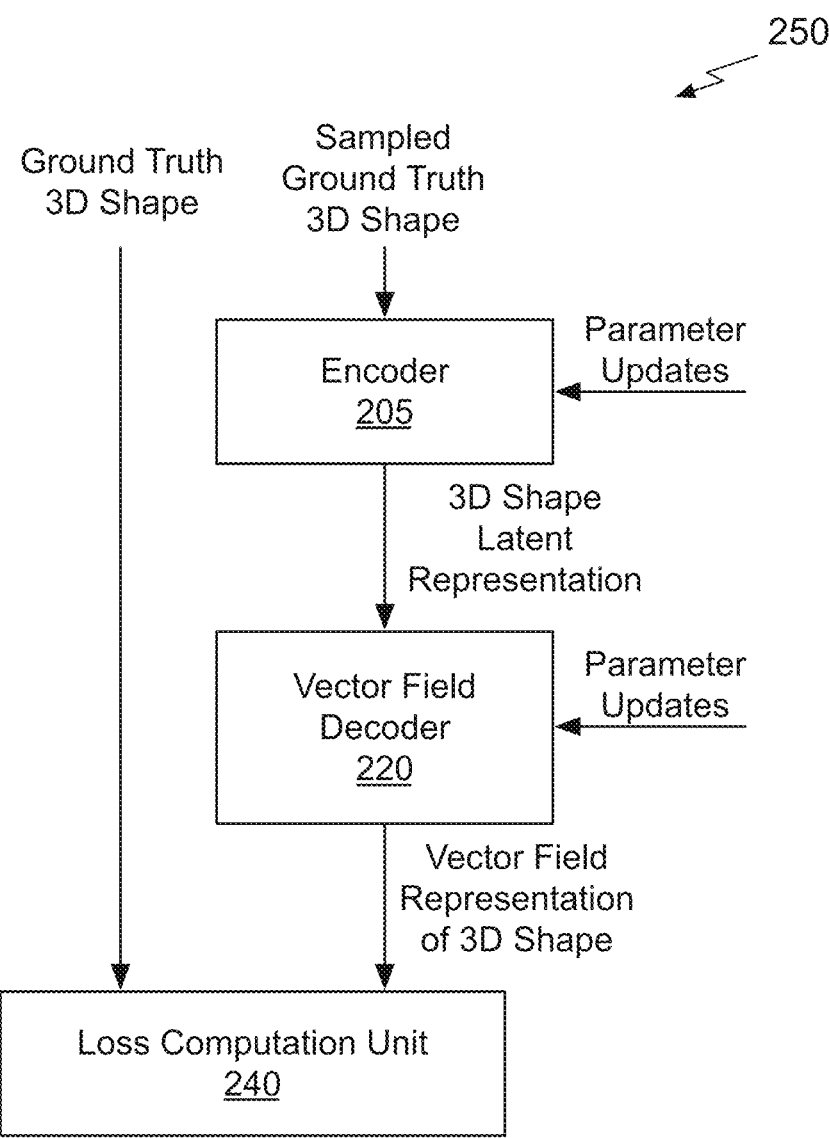
FIG. 2C illustrates a block diagram of an example 3D shape synthesis system training configuration suitable for use in implementing some embodiments of the present disclosure.

FIG. 2C illustrates a block diagram of an example 3D shape synthesis system training configuration 250 suitable for use in implementing some embodiments of the present disclosure. The training configuration shown in FIG. 2C includes an encoder 205, the vector field decoder 220, and a loss computation unit 240. The encoder 205 receives samples of the ground truth 3D shape, such as a mesh.

The loss computation unit 240 samples the ground truth 3D shape to provide a ground truth vector field for comparison with the vector field representation of the 3D shape predicted by the vector field prediction unit 215 within the vector field decoder 220. The loss computation unit 240 evaluates a loss function (truncated regression loss, using a truncation threshold) to compute parameter updates for the encoder 205, decoder 210, and MLP within the vector field prediction unit 215. Once the encoder 205 and the vector field decoder 220 are trained, the 3D shape latent representations generated by the encoder 205 and corresponding ground truth text descriptions of the 3D shapes may be used to provide ground truth supervision for training the diffusion model 225 shown in FIG. 2B.

During training, the encoder 205 and the vector field decoder 220 are configured to receive samples of the ground truth 3D shape and predicts a vector field representation of the 3D shape corresponding to the ground truth 3D shape. The loss computation unit 240 compares the ground truth 3D shapes with the predicted vector field representations of the 3D shapes and computes parameter updates for the encoder 205 and the vector field decoder 220 to reduce differences between the ground truth 3D shapes with the vector field representations of the 3D shapes.

In an embodiment, the encoder 205 is based on 3D convolutions, and the 3D shape is discretized before being input to the encoder 205. In an embodiment, the ground truth 3D shape is sampled to provide a 3D point cloud as an input to the encoder 205 or to provide an unsigned distance field as an input to the vector field decoder 220. In an embodiment, the ground truth 3D shape is a mesh that is sampled to provide a voxel grid and grid-sampled vector field as inputs to the encoder 205 which computes the 3D shape latent representation. In an embodiment, each input 3D shape is converted to a voxel grid via surface voxelization. Note that voxelizing a mesh and computing ground-truth vector fields from a mesh are very fast operations given existing well-optimized GPU implementations. Therefore, the encoder 205 and the vector field decoder 220 may be trained directly on raw mesh datasets, without the need for data preprocessing, unlike conventional techniques. In other words, when the ground truth 3D shape is a mesh, the mesh can be sampled on-the-fly to train the combined encoder 205 and vector field decoder 205 to reconstruct the 3D shape of the mesh.

In an embodiment, the loss computation unit 240 performs regularization and a truncated regression loss, $L\delta$ is used, which only provides full supervision near the surface, $$L_\delta(\hat{v}, v) = \begin{cases} \|\hat{v} - v\|_2, & \|v\|_2 < \delta \\ \delta - \|\hat{v}\|_2, & \|v\|_2 \geq \delta, \|\hat{v}\|_2 < \delta \\ 0, & \text{otherwise.} \end{cases} \qquad \text{Eq. (3)}$$

Intuitively, if the distance between a training sample and the shape surface is larger than a truncation threshold $\delta$, the direction of the vector field at the location on the shape surface can be disregarded. In an embodiment, it is only necessary to ensure that a length of the "distant" vector is greater than the truncation threshold so that the vector does not interfere with surface rendering. In an embodiment, a length of the distant vector is modified to change the length to equal or greater than the threshold distance. Preventing distant vectors from contributing to the loss computation concentrates a capacity of the encoder 205 and the vector field decoder 220 to an area close to the surface, potentially improving the surface quality.

FIG. 3A illustrates a flowchart of a method 300 for synthesizing a 3D shape, in accordance with an embodiment. Each block of method 300, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 300 is described, by way of example, with respect to the 3D shape synthesis system 200, the text to 3D shape synthesis system 230, and/or the example 3D shape synthesis system training configuration 250. However, this method may additionally or alternatively be executed by any one system, or any combination of systems, including, but not limited to, those described herein. Furthermore, persons of ordinary skill in the art will understand that any system that performs method 300 is within the scope and spirit of embodiments of the present disclosure.

At step 310, a latent representation corresponding to the 3D shape is received. In an embodiment, the latent representation comprises a latent code. In an embodiment, the 3D shape synthesis system 200 receives the latent representation. In an embodiment, the latent representation comprises a single feature vector without spatial dimension. In an embodiment, the latent representation comprises a feature grid (e.g., a grid of features with three spatial dimensions). In an embodiment, a decoder neural network processes the latent code to produce the latent representation that comprises a feature grid (e.g., feature volume). In an embodiment, the decoder neural network comprises the decoder 210. In an embodiment, during training of the implicit decoder neural network, an encoder neural network processes samples of the 3D shape to produce the latent representation.

In an embodiment, the samples comprise at least one of a voxel representation of the 3D shape, a grid-sampled vector field representation of the 3D shape, or a point-cloud representation of the 3D shape. In an embodiment, the 3D shape is a mesh that is sampled. In an embodiment, a text description of the 3D shape is processed by a diffusion neural network model to produce the latent representation.

At step 320, learned parameters are applied to the latent representation, by an implicit decoder neural network, to predict a GVF representation of the 3D shape, where the GVF maps points in 3D space to vectors, such that a closest point on a surface of the 3D shape is intersected by moving from a point of the points along a vector that is mapped to the point. In an embodiment, the implicit decoder neural network is included in the vector field prediction unit 215. In an embodiment, during training of the implicit decoder neural network, the learned parameters are updated based on a truncated regression loss function to reduce differences between the generative vector field and a vector field extracted from the 3D shape. In an embodiment, vectors in the generative vector field that are mapped to points within a threshold distance of the surface contribute to the updated learned parameters. In other words, in an embodiment, only vectors that are vectors mapped to sample points that are within the threshold distance are backpropagated to update the learned parameters. In an embodiment, remaining vectors in the generative vector field that are mapped to sample points beyond the threshold distance of the surface and having a length that is less than the threshold distance are modified to change the length to equal or greater than the threshold distance.

In an embodiment, the implicit decoder neural network predicts the generative vector field representation of the 3D shape by performing an interpolation operation on the latent representation to produce a higher resolution latent representation and applying the learned parameters to the higher-resolution latent representation by an MLP to predict the generative vector field representation at sub-voxel resolution. In an embodiment, the 3D shape is associated with a first object category and a second latent representation corresponding to a second 3D shape associated with a second object category that is different compared with the first object category is received. In an embodiment, the learned parameters are applied to the second latent representation by the implicit decoder neural network to predict a second generative vector field representation of the second 3D shape. In an embodiment, 3D shapes in the second object category were not used to train the implicit decoder neural network. In other words, the 3D shapes in the second object category are excluded during training of the implicit decoder neural network.

In an embodiment, at least one of steps 310 or 320 is performed on a server or in a data center to generate the 3D shape and the 3D shape is streamed to a user device. In an embodiment, at least one of steps 310 or 320 is performed within a cloud computing environment. In an embodiment, at least one of steps 310 or 320 is performed for training, testing, or certifying a neural network employed in a machine, robot, or autonomous vehicle. In an embodiment, at least one of steps 310 or 320 is performed on a virtual machine comprising a portion of a graphics processing unit.

Figure 3B:
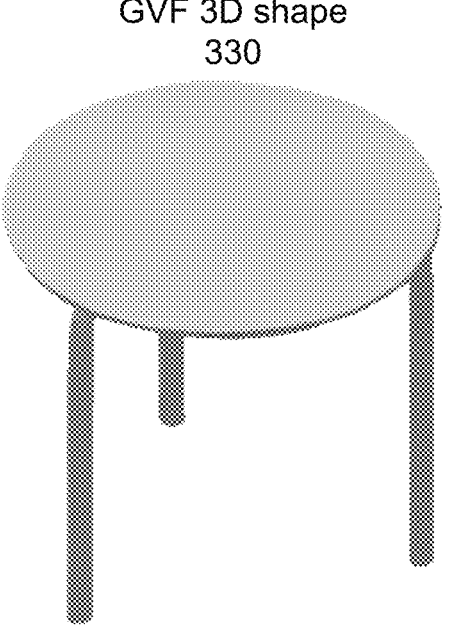
FIG. 3B illustrates text-driven synthesized 3D shapes, in accordance with an embodiment.
Figure 3B:
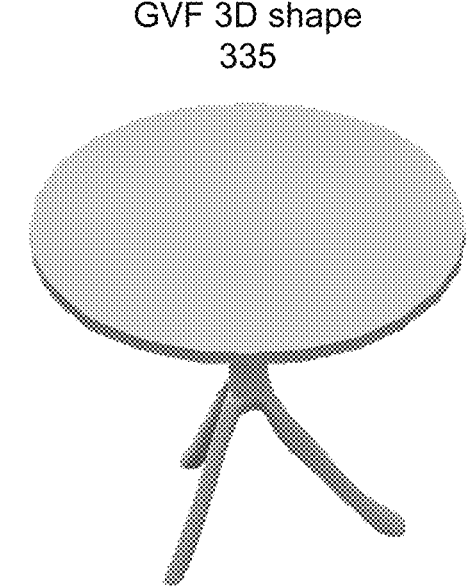
Figure 3B:
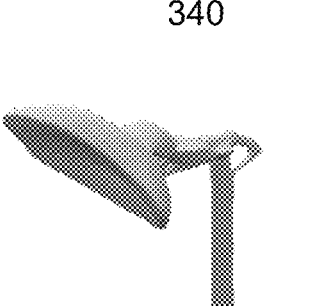
Figure 3B:
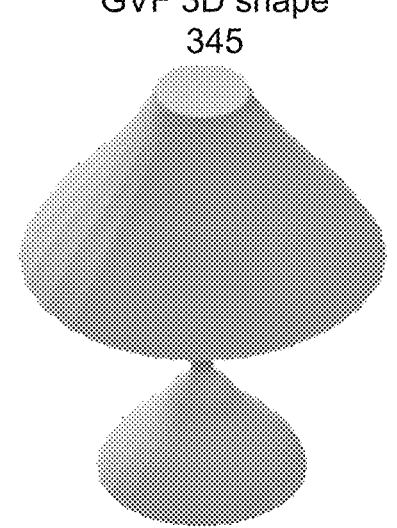

FIG. 3B illustrates text-driven synthesized 3D shapes, in accordance with an embodiment. A generative model, such as the text to 3D shape synthesis system 230 reconstructs a 3D shape of a chair in the GVF representation according to an input 3D shape text description. GVF 3D shapes 330 and 335 are generated in response to "a round table with three legs." GVF 3D shapes 340 and 345 are generated in response to "a fancy lamp."

The generative model can even generalize to new, unseen categories and combinations that were not used during training, thereby performing zero-shot 3D shape synthesis. Unlike generators that target other representations, such as 3PSDF and UDF, the text to 3D shape synthesis system 230 and the 3D shape synthesis system 200 can be trained on a large collection of unprocessed shape data, allowing for improved scaling of training and generalization.

Figure 3C:
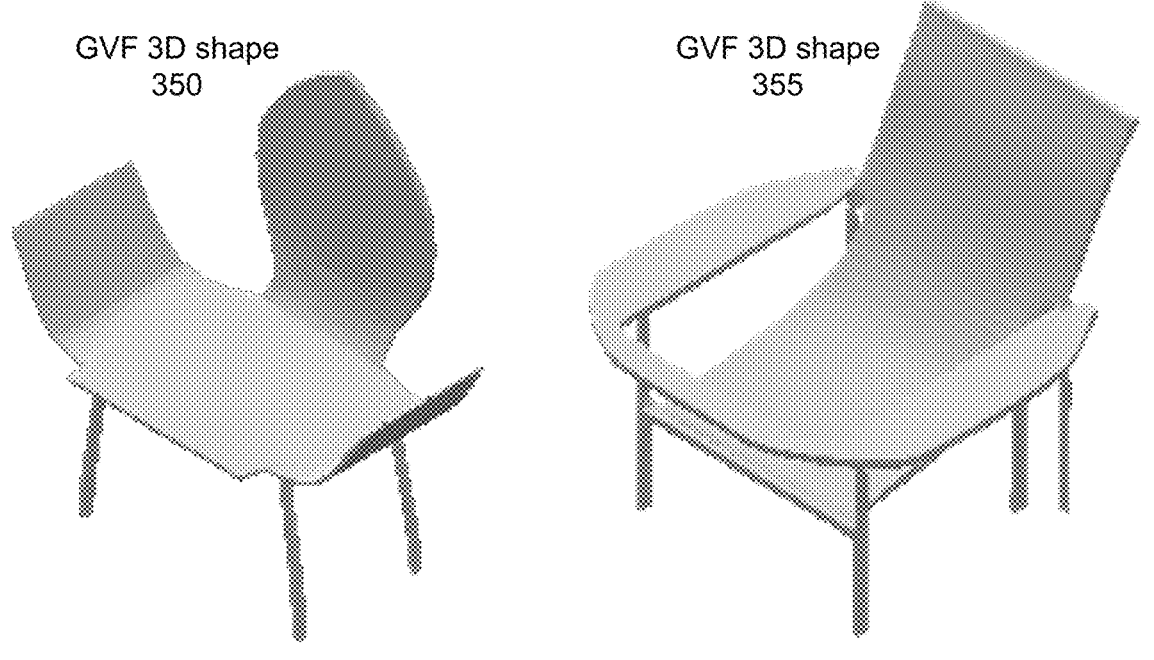
FIG. 3C illustrates text-driven zero-shot synthesized 3D shapes, in accordance with an embodiment.
Figure 3C:
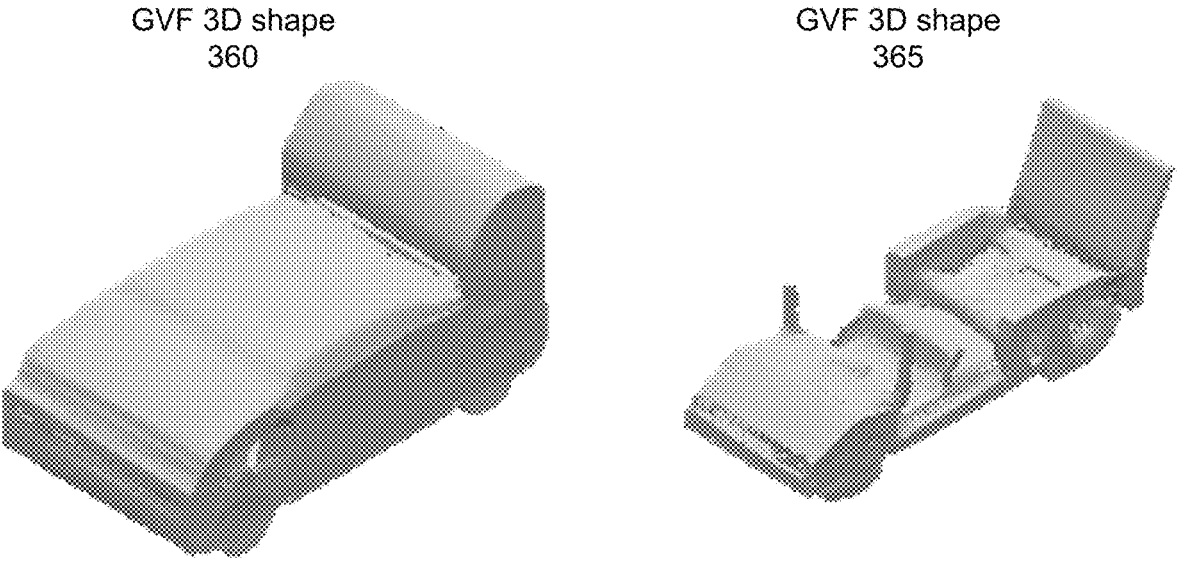

FIG. 3C illustrates text-driven zero-shot synthesized 3D shapes, in accordance with an embodiment. A generative model, such as the text to 3D shape synthesis system 230 reconstructs an unseen 3D shape in the GVF representation according to an unseen input 3D shape text description. GVF 3D shapes 350 and 355 are generated in response to "table+ chair." GVF 3D shapes 360 and 365 are generated in response to "car+couch."

The GVF representation overcomes issues such synthesizing non-watertight (open) surfaces without requiring surface normal orientations and is amenable to learning on large-scale multi-category 3D datasets. Furthermore, the GVF representation is agnostic to surface orientation, all dimensions of the vector field vary smoothly, and there is a one-to-one mapping between a predicted 3D shape and the ground truth 3D shape (i.e., the mapping is bijective). Voxelization and sampling of vector fields from input meshes is performed on-the-fly, without the need for expensive preprocessing. Furthermore, when used for 3D shape synthesis, the GVF representation is scalable, accurate, and high quality. Rather than being limited to synthesizing 3D shapes of a single category, as many conventional generative models are, the vector field decoder 220 can synthesize 3D shapes in multiple categories. Finally, the vector field decoder 220 can also synthesize 3D shapes for objects that were not included in the training dataset. In other words, the vector field decoder is also capable of text-driven and/or zero-shot generation.

Parallel Processing Architecture

Figure 4:
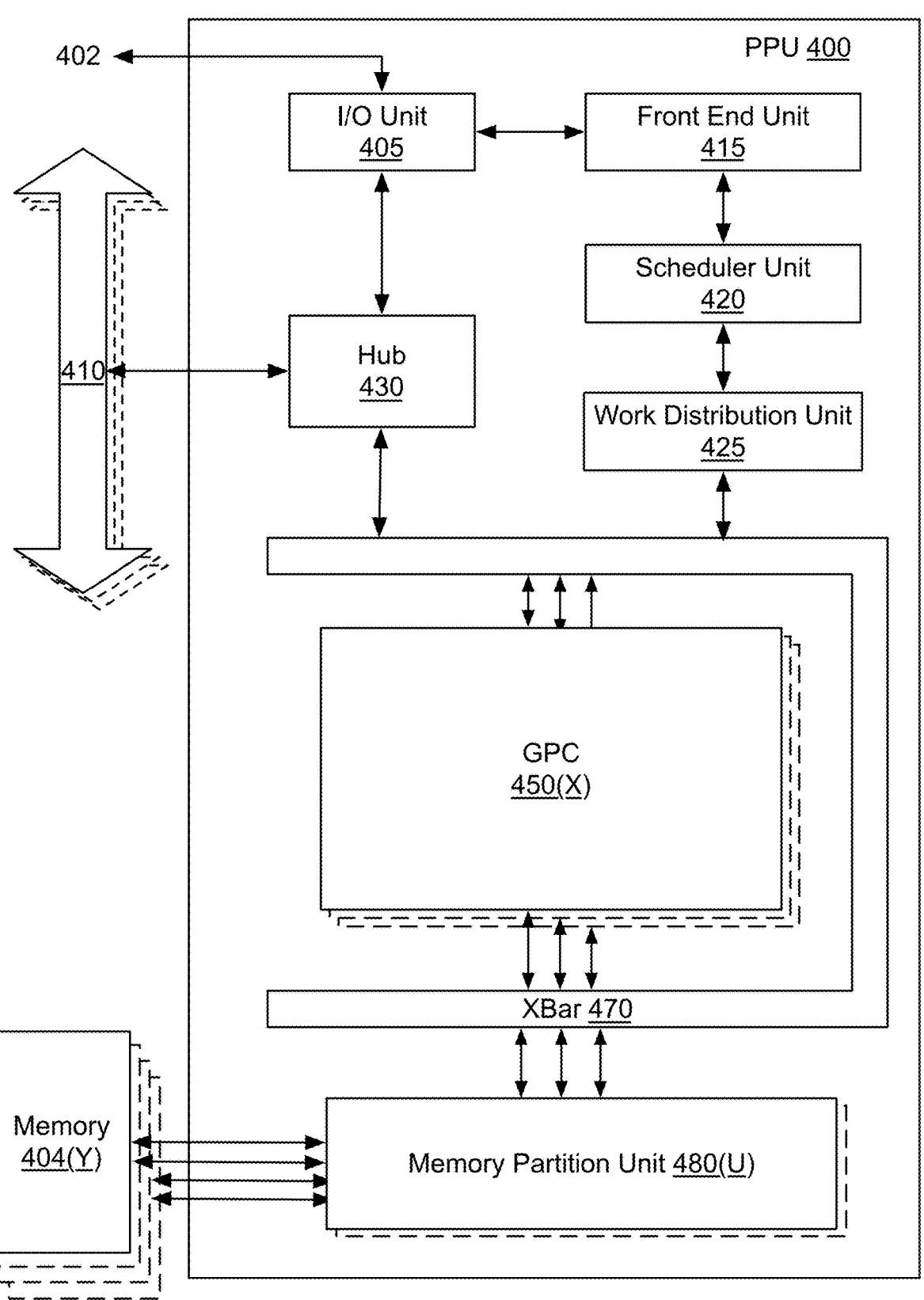
FIG. 4 illustrates an example parallel processing unit suitable for use in implementing some embodiments of the present disclosure.

FIG. 4 illustrates a parallel processing unit (PPU) 400, in accordance with an embodiment. The PPU 400 may be used to implement the 3D shape synthesis system 200, the text to 3D shape synthesis system 230, and/or the example 3D shape synthesis system training configuration 250. The PPU 400 may be used to implement one or more of the decoder 210, the vector field prediction unit 215, the diffusion model 225, the encoder 205, or the loss computation unit 240. In an embodiment, a processor such as the PPU 400 may be configured to implement a neural network model. The neural network model may be implemented as software instructions executed by the processor or, in other embodiments, the processor can include a matrix of hardware elements configured to process a set of inputs (e.g., electrical signals representing values) to generate a set of outputs, which can represent activations of the neural network model. In yet other embodiments, the neural network model can be implemented as a combination of software instructions and processing performed by a matrix of hardware elements. Implementing the neural network model can include determining a set of parameters for the neural network model through, e.g., supervised or unsupervised training of the neural network model as well as, or in the alternative, performing inference using the set of parameters to process novel sets of inputs.

In an embodiment, the PPU 400 is a multi-threaded processor that is implemented on one or more integrated circuit devices. The PPU 400 is a latency hiding architecture designed to process many threads in parallel. A thread (e.g., a thread of execution) is an instantiation of a set of instructions configured to be executed by the PPU 400. In an embodiment, the PPU 400 is a graphics processing unit (GPU) configured to implement a graphics rendering pipeline for processing three-dimensional (3D) graphics data in order to generate two-dimensional (2D) image data for display on a display device. In other embodiments, the PPU 400 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 400 may be configured to accelerate thousands of High Performance Computing (HPC), data center, cloud computing, and machine learning applications. The PPU 400 may be configured to accelerate numerous deep learning systems and applications for autonomous vehicles, simulation, computational graphics such as ray or path tracing, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 4, the PPU 400 includes an Input/ Output (I/O) unit 405, a front end unit 415, a scheduler unit 420, a work distribution unit 425, a hub 430, a crossbar (Xbar) 470, one or more general processing clusters (GPCs) 450, and one or more memory partition units 480. The PPU 400 may be connected to a host processor or other PPUs 400 via one or more high-speed NVLink 410 interconnect. The PPU 400 may be connected to a host processor or other peripheral devices via an interconnect 402. The PPU 400 may also be connected to a local memory 404 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 410 interconnect enables systems to scale and include one or more PPUs 400 combined with one or more CPUs, supports cache coherence between the PPUs 400 and CPUs, and CPU mastering. Data and/or commands may be transmitted by the NVLink 410 through the hub 430 to/from other units of the PPU 400 such as one or more copy engines, a video encoder, a video decoder, a power management unit, etc. (not explicitly shown). The NVLink 410 is described in more detail in conjunction with FIG. 5B.

The I/O unit 405 is configured to transmit and receive communications (e.g., commands, data, etc.) from a host processor (not shown) over the interconnect 402. The I/O unit 405 may communicate with the host processor directly via the interconnect 402 or through one or more intermediate devices such as a memory bridge. In an embodiment, the I/O unit 405 may communicate with one or more other processors, such as one or more the PPUs 400 via the interconnect 402. In an embodiment, the I/O unit 405 implements a Peripheral Component Interconnect Express (PCIe) interface for communications over a PCIe bus and the interconnect 402 is a PCIe bus. In alternative embodiments, the I/O unit 405 may implement other types of well-known interfaces for communicating with external devices.

The I/O unit 405 decodes packets received via the interconnect 402. In an embodiment, the packets represent commands configured to cause the PPU 400 to perform various operations. The I/O unit 405 transmits the decoded commands to various other units of the PPU 400 as the commands may specify. For example, some commands may be transmitted to the front end unit 415. Other commands may be transmitted to the hub 430 or other units of the PPU 400 such as one or more copy engines, a video encoder, a video decoder, a power management unit, etc. (not explicitly shown). In other words, the I/O unit 405 is configured to route communications between and among the various logical units of the PPU 400.

In an embodiment, a program executed by the host processor encodes a command stream in a buffer that provides workloads to the PPU 400 for processing. A workload may comprise several instructions and data to be processed by those instructions. The buffer is a region in a memory that is accessible (e.g., read/write) by both the host processor and the PPU 400. For example, the I/O unit 405 may be configured to access the buffer in a system memory connected to the interconnect 402 via memory requests transmitted over the interconnect 402. In an embodiment, the host processor writes the command stream to the buffer and then transmits a pointer to the start of the command stream to the PPU 400. The front end unit 415 receives pointers to one or more command streams. The front end unit 415 manages the one or more streams, reading commands from the streams and forwarding commands to the various units of the PPU 400.

The front end unit 415 is coupled to a scheduler unit 420 that configures the various GPCs 450 to process tasks defined by the one or more streams. The scheduler unit 420 is configured to track state information related to the various tasks managed by the scheduler unit 420. The state may indicate which GPC 450 a task is assigned to, whether the task is active or inactive, a priority level associated with the task, and so forth. The scheduler unit 420 manages the execution of a plurality of tasks on the one or more GPCs 450.

The scheduler unit 420 is coupled to a work distribution unit 425 that is configured to dispatch tasks for execution on the GPCs 450. The work distribution unit 425 may track a number of scheduled tasks received from the scheduler unit 420. In an embodiment, the work distribution unit 425 manages a pending task pool and an active task pool for each of the GPCs 450. As a GPC 450 finishes the execution of a task, that task is evicted from the active task pool for the GPC 450 and one of the other tasks from the pending task pool is selected and scheduled for execution on the GPC 450. If an active task has been idle on the GPC 450, such as while waiting for a data dependency to be resolved, then the active task may be evicted from the GPC 450 and returned to the pending task pool while another task in the pending task pool is selected and scheduled for execution on the GPC 450.

In an embodiment, a host processor executes a driver kernel that implements an application programming interface (API) that enables one or more applications executing on the host processor to schedule operations for execution on the PPU 400. In an embodiment, multiple compute applications are simultaneously executed by the PPU 400 and the PPU 400 provides isolation, quality of service (QOS), and independent address spaces for the multiple compute applications. An application may generate instructions (e.g., API calls) that cause the driver kernel to generate one or more tasks for execution by the PPU 400. The driver kernel outputs tasks to one or more streams being processed by the PPU 400. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. The tasks may be allocated to one or more processing units within a GPC 450 and instructions are scheduled for execution by at least one warp.

The work distribution unit 425 communicates with the one or more GPCs 450 via XBar 470. The XBar 470 is an interconnect network that couples many of the units of the PPU 400 to other units of the PPU 400. For example, the XBar 470 may be configured to couple the work distribution unit 425 to a particular GPC 450. Although not shown explicitly, one or more other units of the PPU 400 may also be connected to the XBar 470 via the hub 430.

The tasks are managed by the scheduler unit 420 and dispatched to a GPC 450 by the work distribution unit 425. The GPC 450 is configured to process the task and generate results. The results may be consumed by other tasks within the GPC 450, routed to a different GPC 450 via the XBar 470, or stored in the memory 404. The results can be written to the memory 404 via the memory partition units 480, which implement a memory interface for reading and writing data to/from the memory 404. The results can be transmitted to another PPU 400 or CPU via the NVLink 410. In an embodiment, the PPU 400 includes a number U of memory partition units 480 that is equal to the number of separate and distinct memory devices of the memory 404 coupled to the PPU 400. Each GPC 450 may include a memory management unit to provide translation of virtual addresses into physical addresses, memory protection, and arbitration of memory requests. In an embodiment, the memory management unit provides one or more translation lookaside buffers (TLBs) for performing translation of virtual addresses into physical addresses in the memory 404.

In an embodiment, the memory partition unit 480 includes a Raster Operations (ROP) unit, a level two (L2) cache, and a memory interface that is coupled to the memory 404. The memory interface may implement 32, 64, 128, 1024-bit data buses, or the like, for high-speed data transfer. The PPU 400 may be connected to up to Y memory devices, such as high bandwidth memory stacks or graphics double-data-rate, version 5, synchronous dynamic random access memory, or other types of persistent storage. In an embodiment, the memory interface implements an HBM2 memory interface and Y equals half U. In an embodiment, the HBM2 memory stacks are located on the same physical package as the PPU 400, providing substantial power and area savings compared with conventional GDDR5 SDRAM systems. In an embodiment, each HBM2 stack includes four memory dies and Y equals 4, with each HBM2 stack including two 128-bit channels per die for a total of 8 channels and a data bus width of 1024 bits.

In an embodiment, the memory 404 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 400 process very large datasets and/or run applications for extended periods.

In an embodiment, the PPU 400 implements a multi-level memory hierarchy. In an embodiment, the memory partition unit 480 supports a unified memory to provide a single unified virtual address space for CPU and PPU 400 memory, enabling data sharing between virtual memory systems. In an embodiment the frequency of accesses by a PPU 400 to memory located on other processors is traced to ensure that memory pages are moved to the physical memory of the PPU 400 that is accessing the pages more frequently. In an embodiment, the NVLink 410 supports address translation services allowing the PPU 400 to directly access a CPU's page tables and providing full access to CPU memory by the PPU 400.

In an embodiment, copy engines transfer data between multiple PPUs 400 or between PPUs 400 and CPUs. The copy engines can generate page faults for addresses that are not mapped into the page tables. The memory partition unit 480 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 404 or other system memory may be fetched by the memory partition unit 480 and stored in an L2 cache, which is located on-chip and is shared between the various GPCs 450. As shown, each memory partition unit 480 includes a portion of the L2 cache associated with a corresponding memory 404. Lower level caches may then be implemented in various units within the GPCs 450. For example, each of the processing units within a GPC 450 may implement a level one (L1) cache. The L1 cache is private memory that is dedicated to a particular processing unit. The L2 cache is coupled to the memory interface 470 and the XBar 470 and data from the L2 cache may be fetched and stored in each of the L1 caches for processing.

In an embodiment, the processing units within each GPC 450 implement a SIMD (Single-Instruction, Multiple-Data) architecture where each thread in a group of threads (e.g., a warp) is configured to process a different set of data based on the same set of instructions. All threads in the group of threads execute the same instructions. In another embodiment, the processing unit implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

Each processing unit includes a large number (e.g., 128, etc.) of distinct processing cores (e.g., functional units) that may be fully-pipelined, single-precision, double-precision, and/or mixed precision and include a floating point arithmetic logic unit and an integer arithmetic logic unit. In an embodiment, the floating point arithmetic logic units implement the IEEE 754-2008 standard for floating point arithmetic. In an embodiment, the cores include 64 single-precision (32-bit) floating point cores, 64 integer cores, 32 double-precision (64-bit) floating point cores, and 8 tensor cores.

Tensor cores configured to perform matrix operations. In particular, the tensor cores are configured to perform deep learning matrix arithmetic, such as GEMM (matrix-matrix multiplication) for convolution operations during neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B may be integer, fixed-point, or floating point matrices, while the accumulation matrices C and D may be integer, fixed-point, or floating point matrices of equal or higher bitwidths. In an embodiment, tensor cores operate on one, four, or eight bit integer input data with 32-bit integer accumulation. The 8-bit integer matrix multiply requires 1024 operations and results in a full precision product that is then accumulated using 32-bit integer addition with the other intermediate products for a 8×8×16 matrix multiply. In an embodiment, tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each processing unit may also comprise M special function units (SFUs) that perform special functions (e.g., attribute evaluation, reciprocal square root, and the like). In an embodiment, the SFUs may include a tree traversal unit configured to traverse a hierarchical tree data structure. In an embodiment, the SFUs may include texture unit configured to perform texture map filtering operations. In an embodiment, the texture units are configured to load texture maps (e.g., a 2D array of texels) from the memory 404 and sample the texture maps to produce sampled texture values for use in shader programs executed by the processing unit. In an embodiment, the texture maps are stored in shared memory that may comprise or include an L1 cache. The texture units implement texture operations such as filtering operations using mip-maps (e.g., texture maps of varying levels of detail). In an embodiment, each processing unit includes two texture units.

Each processing unit also comprises N load store units (LSUs) that implement load and store operations between the shared memory and the register file. Each processing unit includes an interconnect network that connects each of the cores to the register file and the LSU to the register file, shared memory. In an embodiment, the interconnect network is a crossbar that can be configured to connect any of the cores to any of the registers in the register file and connect the LSUs to the register file and memory locations in shared memory.

The shared memory is an array of on-chip memory that allows for data storage and communication between the processing units and between threads within a processing unit. In an embodiment, the shared memory comprises 128 KB of storage capacity and is in the path from each of the processing units to the memory partition unit 480. The shared memory can be used to cache reads and writes. One or more of the shared memory, L1 cache, L2 cache, and memory 404 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory enables the shared memory to function as a high-throughput conduit for streaming data while simultaneously providing high-bandwidth and low-latency access to frequently reused data.

When configured for general purpose parallel computation, a simpler configuration can be used compared with graphics processing. Specifically, fixed function graphics processing units, are bypassed, creating a much simpler programming model. In the general purpose parallel computation configuration, the work distribution unit 425 assigns and distributes blocks of threads directly to the processing units within the GPCs 450. Threads execute the same program, using a unique thread ID in the calculation to ensure each thread generates unique results, using the processing unit(s) to execute the program and perform calculations, shared memory to communicate between threads, and the LSU to read and write global memory through the shared memory and the memory partition unit 480. When configured for general purpose parallel computation, the processing units can also write commands that the scheduler unit 420 can use to launch new work on the processing units.

The PPUs 400 may each include, and/or be configured to perform functions of, one or more processing cores and/or components thereof, such as Tensor Cores (TCs), Tensor Processing Units (TPUs), Pixel Visual Cores (PVCs), Ray Tracing (RT) Cores, Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The PPU 400 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 400 is embodied on a single semiconductor substrate. In another embodiment, the PPU 400 is included in a system-on-a-chip (SoC) along with one or more other devices such as additional PPUs 400, the memory 404, a reduced instruction set computer (RISC) CPU, a memory management unit (MMU), a digital-to-analog converter (DAC), and the like.

In an embodiment, the PPU 400 may be included on a graphics card that includes one or more memory devices. The graphics card may be configured to interface with a PCIe slot on a motherboard of a desktop computer. In yet another embodiment, the PPU 400 may be an integrated graphics processing unit (iGPU) or parallel processor included in the chipset of the motherboard. In yet another embodiment, the PPU 400 may be realized in reconfigurable hardware. In yet another embodiment, parts of the PPU 400 may be realized in reconfigurable hardware.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5A:
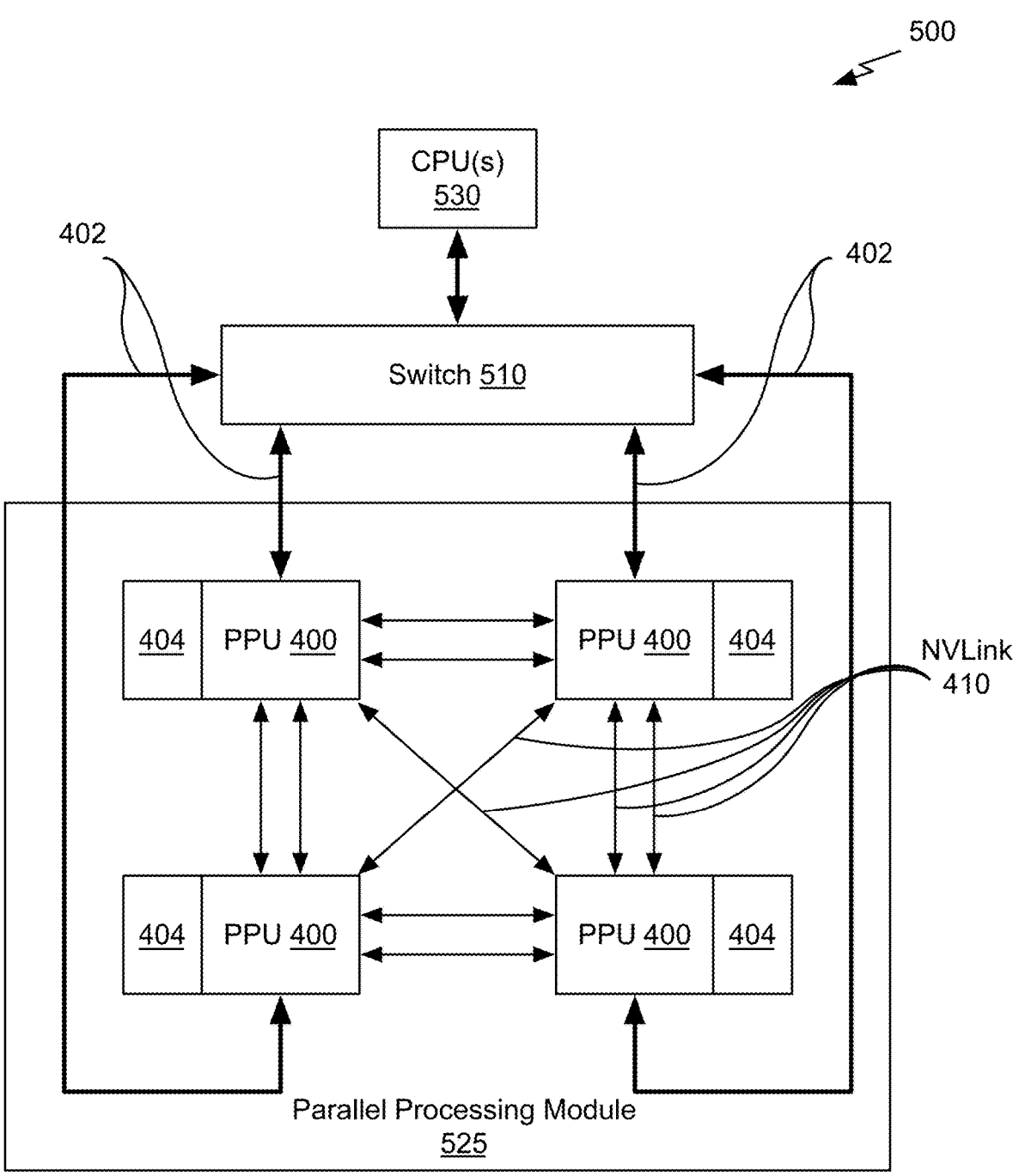
FIG. 5A is a conceptual diagram of a processing system implemented using the PPU of FIG. 4, suitable for use in implementing some embodiments of the present disclosure.

FIG. 5A is a conceptual diagram of a processing system 500 implemented using the PPU 400 of FIG. 4, in accordance with an embodiment. The exemplary system 500 may be configured to implement the method 300 shown in FIG. 3A. The processing system 500 includes a CPU 530, switch 510, and multiple PPUs 400, and respective memories 404.

Figure 5B:
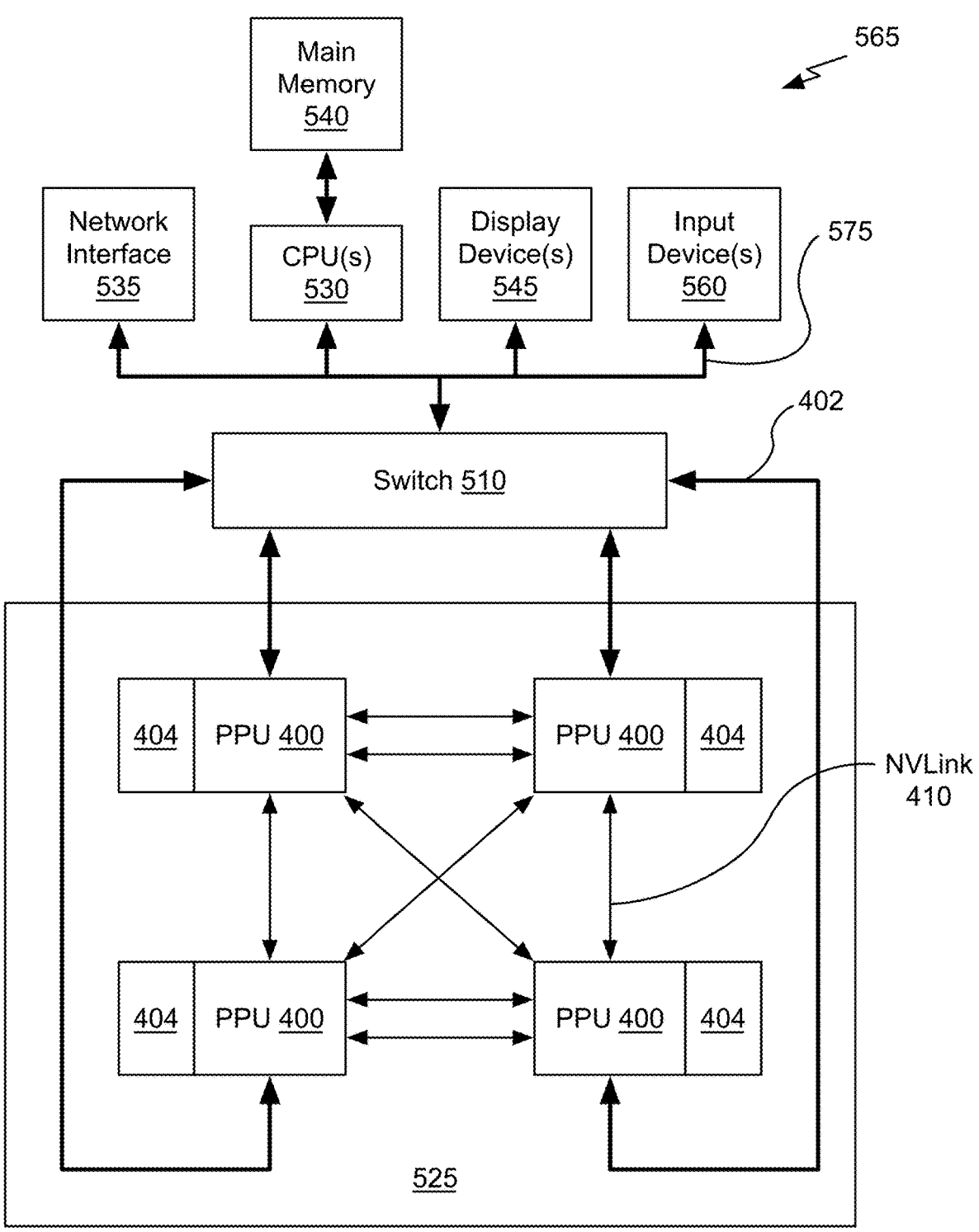
FIG. 5B illustrates an exemplary system in which the various architecture and/or functionality of the various previous embodiments may be implemented.

The NVLink 410 provides high-speed communication links between each of the PPUs 400. Although a particular number of NVLink 410 and interconnect 402 connections are illustrated in FIG. 5B, the number of connections to each PPU 400 and the CPU 530 may vary. The switch 510 interfaces between the interconnect 402 and the CPU 530. The PPUs 400, memories 404, and NVLinks 410 may be situated on a single semiconductor platform to form a parallel processing module 525. In an embodiment, the switch 510 supports two or more protocols to interface between various different connections and/or links.

In another embodiment (not shown), the NVLink 410 provides one or more high-speed communication links between each of the PPUs 400 and the CPU 530 and the switch 510 interfaces between the interconnect 402 and each of the PPUs 400. The PPUs 400, memories 404, and interconnect 402 may be situated on a single semiconductor platform to form a parallel processing module 525. In yet another embodiment (not shown), the interconnect 402 provides one or more communication links between each of the PPUs 400 and the CPU 530 and the switch 510 interfaces between each of the PPUs 400 using the NVLink 410 to provide one or more high-speed communication links between the PPUs 400. In another embodiment (not shown), the NVLink 410 provides one or more high-speed communication links between the PPUs 400 and the CPU 530 through the switch 510. In yet another embodiment (not shown), the interconnect 402 provides one or more communication links between each of the PPUs 400 directly. One or more of the NVLink 410 high-speed communication links may be implemented as a physical NVLink interconnect or either an on-chip or on-die interconnect using the same protocol as the NVLink 410.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 400 and/or memories 404 may be packaged devices. In an embodiment, the CPU 530, switch 510, and the parallel processing module 525 are situated on a single semiconductor platform.

In an embodiment, the signaling rate of each NVLink 410 is 20 to 25 Gigabits/second and each PPU 400 includes six NVLink 410 interfaces (as shown in FIG. 5A, five NVLink 410 interfaces are included for each PPU 400). Each NVLink 410 provides a data transfer rate of 25 Gigabytes/second in each direction, with six links providing 400 Gigabytes/second. The NVLinks 410 can be used exclusively for PPU-to-PPU communication as shown in FIG. 5A, or some combination of PPU-to-PPU and PPU-to-CPU, when the CPU 530 also includes one or more NVLink 410 interfaces.

In an embodiment, the NVLink 410 allows direct load/store/atomic access from the CPU 530 to each PPU's 400 memory 404. In an embodiment, the NVLink 410 supports coherency operations, allowing data read from the memories 404 to be stored in the cache hierarchy of the CPU 530, reducing cache access latency for the CPU 530. In an embodiment, the NVLink 410 includes support for Address Translation Services (ATS), allowing the PPU 400 to directly access page tables within the CPU 530. One or more of the NVLinks 410 may also be configured to operate in a low-power mode.

FIG. 5B illustrates an exemplary system 565 in which the various architecture and/or functionality of the various pre-vious embodiments may be implemented. The exemplary system 565 may be configured to implement the method 300 shown in FIG. 3A.

As shown, a system 565 is provided including at least one central processing unit 530 that is connected to a communication bus 575. The communication bus 575 may directly or indirectly couple one or more of the following devices: main memory 540, network interface 535, CPU(s) 530, display device(s) 545, input device(s) 560, switch 510, and parallel processing system 525. The communication bus 575 may be implemented using any suitable protocol and may represent one or more links or busses, such as an address bus, a data bus, a control bus, or a combination thereof. The communication bus 575 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, HyperTransport, and/or another type of bus or link. In some embodiments, there are direct connections between components. As an example, the CPU(s) 530 may be directly connected to the main memory 540. Further, the CPU(s) 530 may be directly connected to the parallel processing system 525. Where there is direct, or point-to-point connection between components, the communication bus 575 may include a PCIe link to carry out the connection. In these examples, a PCI bus need not be included in the system 565.

Although the various blocks of FIG. 5B are shown as connected via the communication bus 575 with lines, this is not intended to be limiting and is for clarity only. For example, in some embodiments, a presentation component, such as display device(s) 545, may be considered an I/O component, such as input device(s) 560 (e.g., if the display is a touch screen). As another example, the CPU(s) 530 and/or parallel processing system 525 may include memory (e.g., the main memory 540 may be representative of a storage device in addition to the parallel processing system 525, the CPUs 530, and/or other components). In other words, the computing device of FIG. 5B is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5B.

The system 565 also includes a main memory 540. Control logic (software) and data are stored in the main memory 540 which may take the form of a variety of computer-readable media. The computer-readable media may be any available media that may be accessed by the system 565. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the main memory 540 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by system 565. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

Computer programs, when executed, enable the system 565 to perform various functions. The CPU(s) 530 may be configured to execute at least some of the computer-readable instructions to control one or more components of the system 565 to perform one or more of the methods and/or processes described herein. The CPU(s) 530 may each include one or more cores (e.g., one, two, four, eight, twenty-eight, seventy-two, etc.) that are capable of handling a multitude of software threads simultaneously. The CPU(s) 530 may include any type of processor, and may include different types of processors depending on the type of system 565 implemented (e.g., processors with fewer cores for mobile devices and processors with more cores for servers). For example, depending on the type of system 565, the processor may be an Advanced RISC Machines (ARM) processor implemented using Reduced Instruction Set Computing (RISC) or an x86 processor implemented using Complex Instruction Set Computing (CISC). The system 565 may include one or more CPUs 530 in addition to one or more microprocessors or supplementary co-processors, such as math co-processors.

In addition to or alternatively from the CPU(s) 530, the parallel processing module 525 may be configured to execute at least some of the computer-readable instructions to control one or more components of the system 565 to perform one or more of the methods and/or processes described herein. The parallel processing module 525 may be used by the system 565 to render graphics (e.g., 3D graphics) or perform general purpose computations. For example, the parallel processing module 525 may be used for General-Purpose computing on GPUs (GPGPU). In embodiments, the CPU(s) 530 and/or the parallel processing module 525 may discretely or jointly perform any combination of the methods, processes and/or portions thereof.

The system 565 also includes input device(s) 560, the parallel processing system 525, and display device(s) 545. The display device(s) 545 may include a display (e.g., a monitor, a touch screen, a television screen, a heads-up-display (HUD), other display types, or a combination thereof), speakers, and/or other presentation components. The display device(s) 545 may receive data from other components (e.g., the parallel processing system 525, the CPU(s) 530, etc.), and output the data (e.g., as an image, video, sound, etc.).

The network interface 535 may enable the system 565 to be logically coupled to other devices including the input devices 560, the display device(s) 545, and/or other components, some of which may be built in to (e.g., integrated in) the system 565. Illustrative input devices 560 include a microphone, mouse, keyboard, joystick, game pad, game controller, satellite dish, scanner, printer, wireless device, etc. The input devices 560 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the system 565. The system 565 may be include depth cameras, such as stereoscopic camera systems, infrared camera systems, RGB camera systems, touchscreen technology, and combinations of these, for gesture detection and recognition. Additionally, the system 565 may include accelerometers or gyroscopes (e.g., as part of an inertia measurement unit (IMU)) that enable detection of motion. In some examples, the output of the accelerometers or gyroscopes may be used by the system 565 to render immersive augmented reality or virtual reality.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes. The system 565 may be included within a distributed network and/or cloud computing environment.

The network interface 535 may include one or more receivers, transmitters, and/or transceivers that enable the system 565 to communicate with other computing devices via an electronic communication network, included wired and/or wireless communications. The network interface 535 may be implemented as a network interface controller (NIC) that includes one or more data processing units (DPUs) to perform operations such as (for example and without limitation) packet parsing and accelerating network processing and communication. The network interface 535 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The system 565 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. The system 565 may also include a hard-wired power supply, a battery power supply, or a combination thereof (not shown). The power supply may provide power to the system 565 to enable the components of the system 565 to operate.

Each of the foregoing modules and/or devices may even be situated on a single semiconductor platform to form the system 565. Alternately, the various modules may also be situated separately or in various combinations of semiconductor platforms per the desires of the user. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the processing system 500 of FIG. 5A and/or exemplary system 565 of FIG. 5B—e.g., each device may include similar components, features, and/or functionality of the processing system 500 and/or exemplary system 565.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example processing system 500 of FIG. 5A and/or exemplary system 565 of FIG. 5B. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Machine Learning

Deep neural networks (DNNs) developed on processors, such as the PPU 400 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 400. Inferencing is less compute-intensive than training, being a latency-sensitive process where a trained neural network is applied to new inputs it has not seen before to classify images, detect emotions, identify recommendations, recognize and translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 400 is a computing platform capable of delivering performance required for deep neural network-based artificial intelligence and machine learning applications.

Furthermore, 3D shapes and/or images generated applying one or more of the techniques disclosed herein may be used to train, test, or certify DNNs used to recognize objects and environments in the real world. Such 3D shapes and/or images may include scenes of roadways, factories, buildings, urban settings, rural settings, humans, animals, and any other physical object or real-world setting. Such 3D shapes and/or images may be used to train, test, or certify DNNs that are employed in machines or robots to manipulate, handle, or modify physical objects in the real world. Furthermore, such 3D shapes and/or images may be used to train, test, or certify DNNs that are employed in autonomous vehicles to navigate and move the vehicles through the real world. Additionally, 3D shapes and/or images generated applying one or more of the techniques disclosed herein may be used to convey information to users of such machines, robots, and vehicles.

Figure 5C:
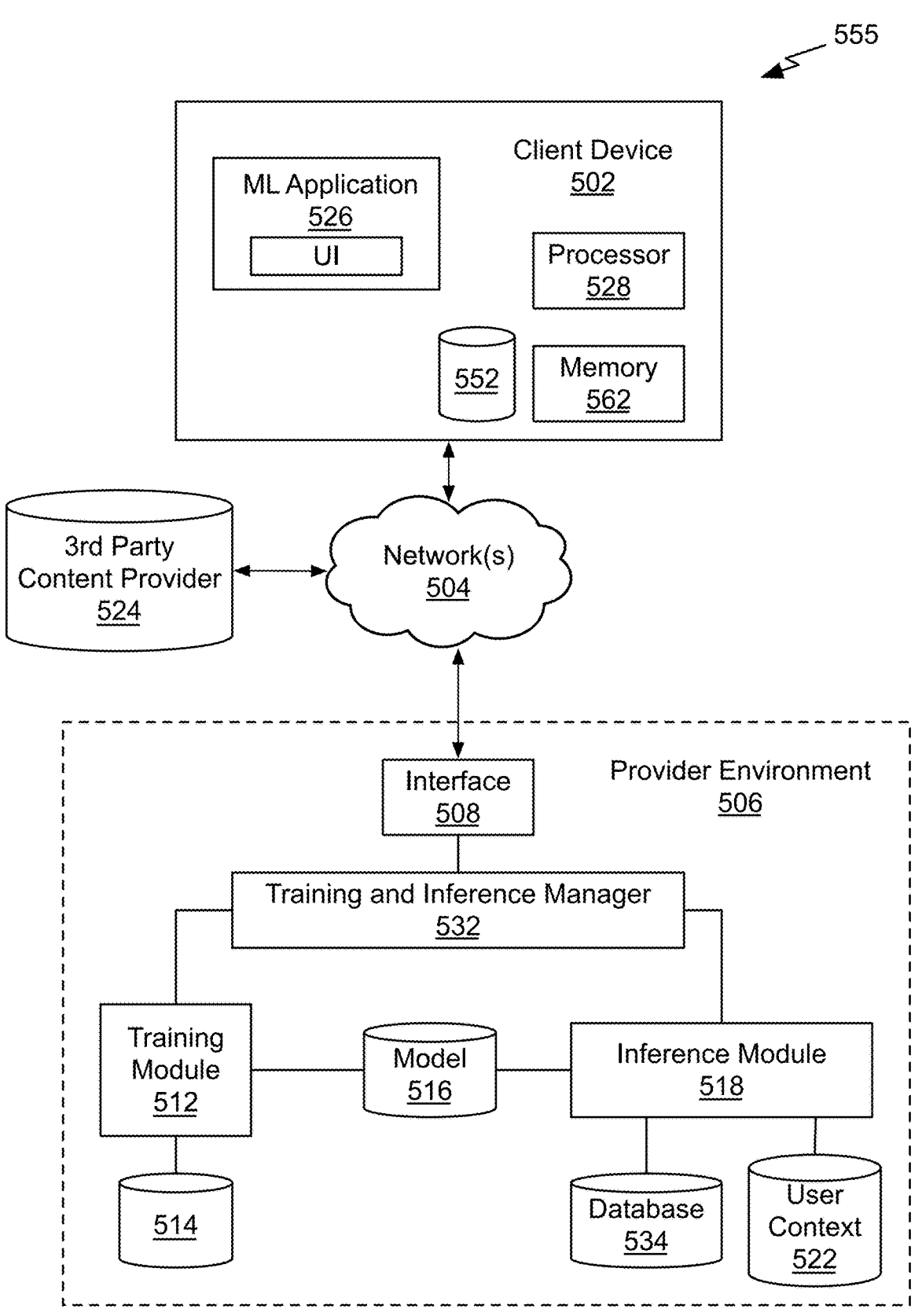
FIG. 5C illustrates components of an exemplary system that can be used to train and utilize machine learning, in at least one embodiment.

FIG. 5C illustrates components of an exemplary system 555 that can be used to train and utilize machine learning, in accordance with at least one embodiment. As will be discussed, various components can be provided by various combinations of computing devices and resources, or a single computing system, which may be under control of a single entity or multiple entities. Further, aspects may be triggered, initiated, or requested by different entities. In at least one embodiment training of a neural network might be instructed by a provider associated with provider environment 506, while in at least one embodiment training might be requested by a customer or other user having access to a provider environment through a client device 502 or other such resource. In at least one embodiment, training data (or data to be analyzed by a trained neural network) can be provided by a provider, a user, or a third party content provider 524. In at least one embodiment, client device 502 may be a vehicle or object that is to be navigated on behalf of a user, for example, which can submit requests and/or receive instructions that assist in navigation of a device.

In at least one embodiment, requests are able to be submitted across at least one network 504 to be received by a provider environment 506. In at least one embodiment, a client device may be any appropriate electronic and/or computing devices enabling a user to generate and send such requests, such as, but not limited to, desktop computers, notebook computers, computer servers, smartphones, tablet computers, gaming consoles (portable or otherwise), computer processors, computing logic, and set-top boxes. Network(s) 504 can include any appropriate network for transmitting a request or other such data, as may include Internet, an intranet, an Ethernet, a cellular network, a local area network (LAN), a wide area network (WAN), a personal area network (PAN), an ad hoc network of direct wireless connections among peers, and so on.

In at least one embodiment, requests can be received at an interface layer 508, which can forward data to a training and inference manager 532, in this example. The training and inference manager 532 can be a system or service including hardware and software for managing requests and service corresponding data or content, in at least one embodiment, the training and inference manager 532 can receive a request to train a neural network, and can provide data for a request to a training module 512. In at least one embodiment, training module 512 can select an appropriate model or neural network to be used, if not specified by the request, and can train a model using relevant training data. In at least one embodiment, training data can be a batch of data stored in a training data repository 514, received from client device 502, or obtained from a third party provider 524. In at least one embodiment, training module 512 can be responsible for training data. A neural network can be any appropriate network, such as a recurrent neural network (RNN) or convolutional neural network (CNN). Once a neural network is trained and successfully evaluated, a trained neural network can be stored in a model repository 516, for example, that may store different models or networks for users, applications, or services, etc. In at least one embodiment, there may be multiple models for a single application or entity, as may be utilized based on a number of different factors.

In at least one embodiment, at a subsequent point in time, a request may be received from client device 502 (or another such device) for content (e.g., path determinations) or data that is at least partially determined or impacted by a trained neural network. This request can include, for example, input data to be processed using a neural network to obtain one or more inferences or other output values, classifications, or predictions, or for at least one embodiment, input data can be received by interface layer 508 and directed to inference module 518, although a different system or service can be used as well. In at least one embodiment, inference module 518 can obtain an appropriate trained network, such as a trained deep neural network (DNN) as discussed herein, from model repository 516 if not already stored locally to inference module 518. Inference module 518 can provide data as input to a trained network, which can then generate one or more inferences as output. This may include, for example, a classification of an instance of input data. In at least one embodiment, inferences can then be transmitted to client device 502 for display or other communication to a user. In at least one embodiment, context data for a user may also be stored to a user context data repository 522, which may include data about a user which may be useful as input to a network in generating inferences, or determining data to return to a user after obtaining instances. In at least one embodiment, relevant data, which may include at least some of input or inference data, may also be stored to a local database 534 for processing future requests. In at least one embodiment, a user can use account information or other information to access resources or functionality of a provider environment. In at least one embodiment, if permitted and available, user data may also be collected and used to further train models, in order to provide more accurate inferences for future requests. In at least one embodiment, requests may be received through a user interface to a machine learning application 526 executing on client device 502, and results displayed through a same interface. A client device can include resources such as a processor 528 and memory 562 for generating a request and processing results or a response, as well as at least one data storage element 552 for storing data for machine learning application 526.

In at least one embodiment a processor 528 (or a processor of training module 512 or inference module 518) will be a central processing unit (CPU). As mentioned, however, resources in such environments can utilize GPUs to process data for at least certain types of requests. With thousands of cores, GPUs, such as PPU 400 are designed to handle substantial parallel workloads and, therefore, have become popular in deep learning for training neural networks and generating predictions. While use of GPUs for offline builds has enabled faster training of larger and more complex models, generating predictions offline implies that either request-time input features cannot be used or predictions must be generated for all permutations of features and stored in a lookup table to serve real-time requests. If a deep learning framework supports a CPU-mode and a model is small and simple enough to perform a feed-forward on a CPU with a reasonable latency, then a service on a CPU instance could host a model. In this case, training can be done offline on a GPU and inference done in real-time on a CPU. If a CPU approach is not viable, then a service can run on a GPU instance. Because GPUs have different performance and cost characteristics than CPUs, however, running a service that offloads a runtime algorithm to a GPU can require it to be designed differently from a CPU based service.

In at least one embodiment, video data can be provided from client device 502 for enhancement in provider environment 506. In at least one embodiment, video data can be processed for enhancement on client device 502. In at least one embodiment, video data may be streamed from a third party content provider 524 and enhanced by third party content provider 524, provider environment 506, or client device 502. In at least one embodiment, video data can be provided from client device 502 for use as training data in provider environment 506.

In at least one embodiment, supervised and/or unsupervised training can be performed by the client device 502 and/or the provider environment 506. In at least one embodiment, a set of training data 514 (e.g., classified or labeled data) is provided as input to function as training data. In an embodiment, the set of training data may be used in a generative adversarial training configuration to train a generator neural network. In at least one embodiment, training data can include 3D shapes and/or images of at least one human subject, avatar, or character for which a neural network is to be trained. In at least one embodiment, training data can include instances of at least one type of object for which a neural network is to be trained, as well as information that identifies that type of object. In at least one embodiment, training data might include a set of images that each includes a representation of a type of object, where each image also includes, or is associated with, a label, metadata, classification, or other piece of information identifying a type of object represented in a respective image. Various other types of data may be used as training data as well, as may include text data, audio data, video data, and so on. In at least one embodiment, training data 514 is provided as training input to a training module 512. In at least one embodiment, training module 512 can be a system or service that includes hardware and software, such as one or more computing devices executing a training application, for training a neural network (or other model or algorithm, etc.). In at least one embodiment, training module 512 receives an instruction or request indicating a type of model to be used for training, in at least one embodiment, a model can be any appropriate statistical model, network, or algorithm useful for such purposes, as may include an artificial neural network, deep learning algorithm, learning classifier, Bayesian network, and so on. In at least one embodiment, training module 512 can select an initial model, or other untrained model, from an appropriate repository 516 and utilize training data 514 to train a model, thereby generating a trained model (e.g., trained deep neural network) that can be used to classify similar types of data, or generate other such inferences. In at least one embodiment where training data is not used, an appropriate initial model can still be selected for training on input data per training module 512.

In at least one embodiment, a model can be trained in a number of different ways, as may depend in part upon a type of model selected. In at least one embodiment, a machine learning algorithm can be provided with a set of training data, where a model is a model artifact created by a training process. In at least one embodiment, each instance of training data contains a correct answer (e.g., classification), which can be referred to as a target or target attribute. In at least one embodiment, a learning algorithm finds patterns in training data that map input data attributes to a target, an answer to be predicted, and a machine learning model is output that captures these patterns. In at least one embodiment, a machine learning model can then be used to obtain predictions on new data for which a target is not specified.

In at least one embodiment, training and inference manager 532 can select from a set of machine learning models including binary classification, multiclass classification, generative, and regression models. In at least one embodiment, a type of model to be used can depend at least in part upon a type of target to be predicted.

Graphics Processing Pipeline

In an embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (e.g., pixel data for each of the pixels of the display).

An application writes model data for a scene (e.g., a collection of vertices and attributes) to a memory such as a system memory or memory 404. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the processing units within the PPU 400 including one or more of a vertex shader, hull shader, domain shader, geometry shader, and a pixel shader. For example, one or more of the processing units may be configured to execute a vertex shader program that processes a number of vertices defined by the model data. In an embodiment, the different processing units may be configured to execute different shader programs concurrently. For example, a first subset of processing units may be configured to execute a vertex shader program while a second subset of processing units may be configured to execute a pixel shader program. The first subset of processing units processes vertex data to produce processed vertex data and writes the processed vertex data to the L2 cache and/or the memory 404. After the processed vertex data is rasterized (e.g., transformed from three-dimensional data into two-dimensional data in screen space) to produce fragment data, the second subset of processing units executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Images generated applying one or more of the techniques disclosed herein may be displayed on a monitor or other display device. In some embodiments, the display device may be coupled directly to the system or processor generating or rendering the images. In other embodiments, the display device may be coupled indirectly to the system or processor such as via a network. Examples of such networks include the Internet, mobile telecommunications networks, a WIFI network, as well as any other wired and/or wireless networking system. When the display device is indirectly coupled, the images generated by the system or processor may be streamed over the network to the display device. Such streaming allows, for example, video games or other applications, which render images, to be executed on a server, a data center, or in a cloud-based computing environment and the rendered images to be transmitted and displayed on one or more user devices (such as a computer, video game console, smartphone, other mobile device, etc.) that are physically separate from the server or data center. Hence, the techniques disclosed herein can be applied to enhance the images that are streamed and to enhance services that stream images such as NVIDIA Geforce Now (GFN), Google Stadia, and the like.

Example Streaming System

Figure 6:
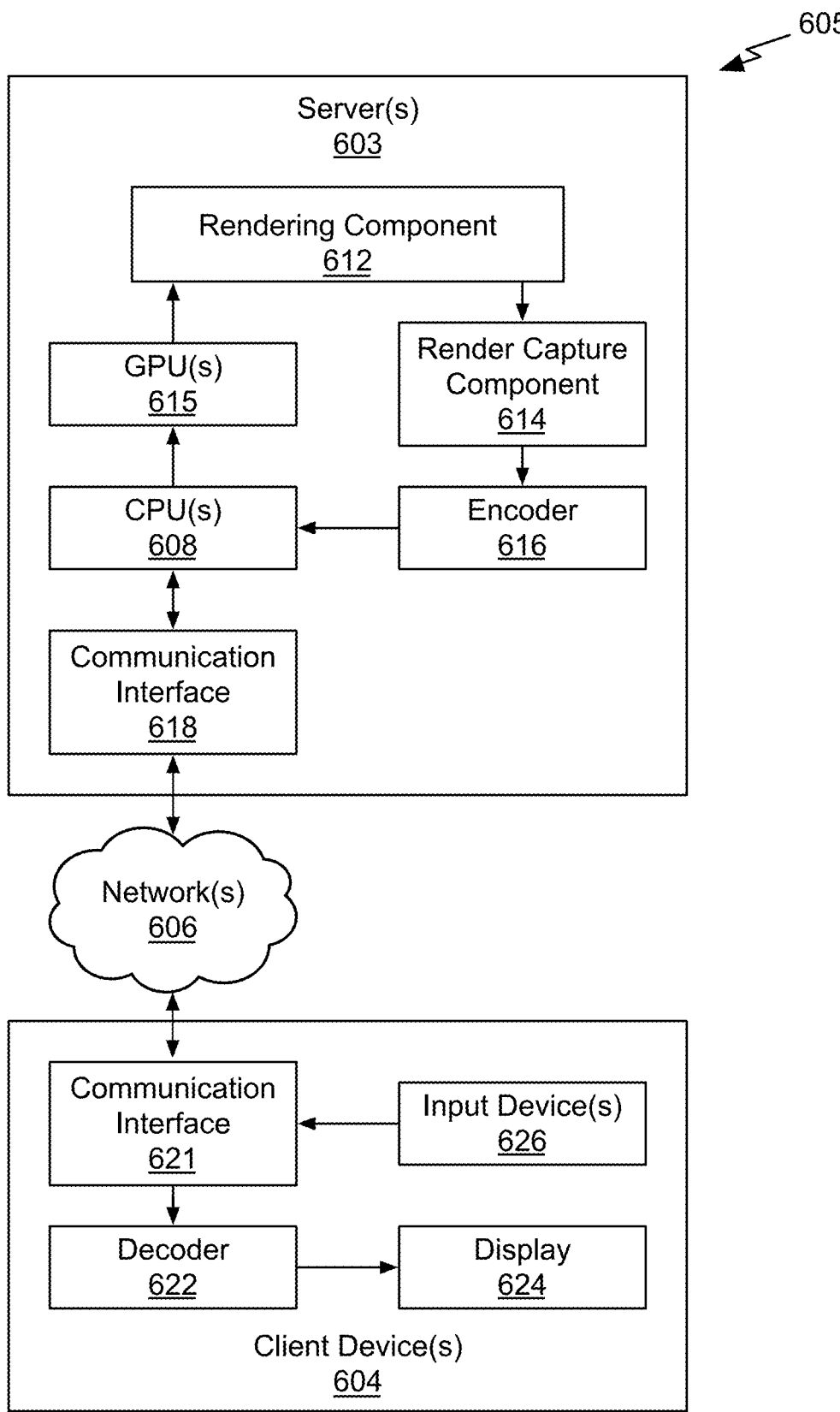
FIG. 6 illustrates an exemplary streaming system suitable for use in implementing some embodiments of the present disclosure.

FIG. 6 is an example system diagram for a streaming system 605, in accordance with some embodiments of the present disclosure. FIG. 6 includes server(s) 603 (which may include similar components, features, and/or functionality to the example processing system 500 of FIG. 5A and/or exemplary system 565 of FIG. 5B), client device(s) 604 (which may include similar components, features, and/or functionality to the example processing system 500 of FIG. 5A and/or exemplary system 565 of FIG. 5B), and network(s) 606 (which may be similar to the network(s) described herein). In some embodiments of the present disclosure, the system 605 may be implemented.

In an embodiment, the streaming system 605 is a game streaming system and the server(s) 603 are game server(s). In the system 605, for a game session, the client device(s) 604 may only receive input data in response to inputs to the input device(s) 626, transmit the input data to the server(s) 603, receive encoded display data from the server(s) 603, and display the display data on the display 624. As such, the more computationally intense computing and processing is offloaded to the server(s) 603 (e.g., rendering—in particular ray or path tracing—for graphical output of the game session is executed by the GPU(s) 615 of the server(s) 603). In other words, the game session is streamed to the client device(s) 604 from the server(s) 603, thereby reducing the requirements of the client device(s) 604 for graphics processing and rendering.

For example, with respect to an instantiation of a game session, a client device 604 may be displaying a frame of the game session on the display 624 based on receiving the display data from the server(s) 603. The client device 604 may receive an input to one of the input device(s) 626 and generate input data in response. The client device 604 may transmit the input data to the server(s) 603 via the communication interface 621 and over the network(s) 606 (e.g., the Internet), and the server(s) 603 may receive the input data via the communication interface 618. The CPU(s) 608 may receive the input data, process the input data, and transmit data to the GPU(s) 615 that causes the GPU(s) 615 to generate a rendering of the game session. For example, the input data may be representative of a movement of a character of the user in a game, firing a weapon, reloading, passing a ball, turning a vehicle, etc. The rendering component 612 may render the game session (e.g., representative of the result of the input data) and the render capture component 614 may capture the rendering of the game session as display data (e.g., as image data capturing the rendered frame of the game session). The rendering of the game session may include ray or path-traced lighting and/or shadow effects, computed using one or more parallel processing units—such as GPUs, which may further employ the use of one or more dedicated hardware accelerators or processing cores to perform ray or path-tracing techniques—of the server(s) 603. The encoder 616 may then encode the display data to generate encoded display data and the encoded display data may be transmitted to the client device 604 over the network(s) 606 via the communication interface 618. The client device 604 may receive the encoded display data via the communication interface 621 and the decoder 622 may decode the encoded display data to generate the display data. The client device 604 may then display the display data via the display 624.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method of synthesizing a three-dimensional (3D) shape, comprising:
  receiving a latent representation corresponding to the 3D shape;
  applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point; and during training of the implicit decoder neural network, the learned parameters are updated based on a truncated regression loss function to reduce differences between the generative vector field and a vector field extracted from the 3D shape.

2. The computer-implemented method of claim 1, wherein the latent representation comprises one of a latent code or a feature grid.

3. The computer-implemented method of claim 1, wherein vectors in the generative vector field that are mapped to points within a threshold distance of the surface contribute to the updated learned parameters.

4. The computer-implemented method of claim 3, wherein remaining vectors in the generative vector field that are mapped to points beyond a threshold distance of the surface and having a length that is less than the threshold distance are modified to change the length to equal or greater than the threshold distance.

5. The computer-implemented method of claim 1, wherein during training of the implicit decoder neural network, an encoder neural network processes samples of the 3D shape to produce the latent representation.

6. The computer-implemented method of claim 5, wherein the samples comprise at least one of a voxel representation of the 3D shape, a grid-sampled vector field representation of the 3D shape, or a point-cloud representation of the 3D shape.

7. A system, comprising:
  a memory that stores learned parameters; and
  a processor that is connected to the memory, wherein the processor is configured to synthesize a three-dimensional (3D) shape by:
    receiving a latent representation corresponding to the 3D shape;
    applying the learned parameters to the latent representation by an implicit decoder neural network to predict a generative vector field representation of the 3D shape, wherein the generative vector field maps points in 3D space to vectors, such that a closest point on a surface of the 3D shape is intersected by moving from a point of the points along a vector that is mapped to the point; and
    during training of the implicit decoder neural network, the learned parameters are updated based on a truncated regression loss function to reduce differences between the generative vector field and a vector field extracted from the 3D shape.

8. A non-transitory computer-readable media storing computer instructions for synthesizing a three-dimensional (3D) shape that, when executed by one or more processors, cause the one or more processors to perform the steps of:
  receiving a latent representation corresponding to the 3D shape;
  applying learned parameters to the latent representation by an implicit decoder neural network to predict a generative vector field representation of the 3D shape, wherein the generative vector field maps points in 3D space to vectors, such that a closest point on a surface of the 3D shape is intersected by moving from a point of the points along a vector that is mapped to the point; and
  during training of the implicit decoder neural network, the learned parameters are updated based on a truncated regression loss function to reduce differences between the generative vector field and a vector field extracted from the 3D shape.

9. A computer-implemented method of synthesizing a three-dimensional (3D) shape, comprising:

receiving a latent code corresponding to the 3D shape;

processing the latent code by a decoder neural network to produce a latent representation that comprises a feature grid; and applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point.

10. A system, comprising:

a memory that stores learned parameters; and a processor that is connected to the memory, wherein the processor is configured to synthesize a three-dimensional (3D) shape by:

receiving a latent code corresponding to the 3D shape;

processing the latent code by a decoder neural network to produce a latent representation that comprises a feature grid; and applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point.

11. A computer-implemented method of synthesizing a three-dimensional (3D) shape, comprising:

receiving a latent representation corresponding to the 3D shape;

performing, by an implicit decoder neural network, an interpolation operation on the latent representation to produce a higher resolution latent representation; and applying the learned parameters to the higher-resolution latent representation by a multilayer perceptron to predict a generative vector field representation of the 3D shape at sub-voxel resolution, wherein the generative vector field representation maps points in 3D space to vectors, such that a closest point on a surface of the 3D shape is intersected by moving from a point of the points along a vector that is mapped to the point.

12. A system, comprising:

a memory that stores learned parameters; and a processor that is connected to the memory, wherein the processor is configured to synthesize a three-dimensional (3D) shape by:

receiving a latent representation corresponding to the 3D shape;

performing, by an implicit decoder neural network, an interpolation operation on the latent representation to produce a higher resolution latent representation; and applying the learned parameters to the higher-resolution latent representation by a multilayer perceptron to predict a generative vector field representation of the 3D shape at sub-voxel resolution, wherein the generative vector field representation maps points in 3D space to vectors, such that a closest point on a surface of the 3D shape is intersected by moving from a point of the points along a vector that is mapped to the point.

13. A computer-implemented method of synthesizing a three-dimensional (3D) shape, comprising:

receiving a latent representation corresponding to the 3D shape, wherein the 3D shape is associated with a first object category;

applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point;

receiving a second latent representation corresponding to a second 3D shape associated with a second object category that is different compared with the first object category; and applying the learned parameters to the second latent representation by the implicit decoder neural network to predict a second generative vector field representation of the second 3D shape.

14. The computer-implemented method of claim 13, wherein 3D shapes in the second object category were not used to train the implicit decoder neural network.

15. A system, comprising:

a memory that stores learned parameters; and a processor that is connected to the memory, wherein the processor is configured to synthesize a three-dimensional (3D) shape by:

receiving a latent representation corresponding to the 3D shape, wherein the 3D shape is associated with a first object category;

applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point;

receiving a second latent representation corresponding to a second 3D shape associated with a second object category that is different compared with the first object category; and applying the learned parameters to the second latent representation by the implicit decoder neural network to predict a second generative vector field representation of the second 3D shape.

16. A computer-implemented method of synthesizing a three-dimensional (3D) shape, comprising:

processing a text description of the 3D shape by a diffusion neural network model to produce a latent representation; and applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point.

17. The computer-implemented method of claim 16, wherein at least one of the steps of processing and applying is performed on a server or in a data center to generate the 3D shape and the 3D shape is streamed to a user device.

18. The computer-implemented method of claim 16, wherein at least one of the steps of processing and applying is performed within a cloud computing environment.

19. The computer-implemented method of claim 16, wherein at least one of the steps of processing and applying is performed for training, testing, or certifying a neural network employed in a machine, robot, or autonomous vehicle.

20. The computer-implemented method of claim 16, wherein at least one of the steps of processing and applying is performed on a virtual machine comprising a portion of a graphics processing unit.

21. A system, comprising:

a memory that stores learned parameters; and a processor that is connected to the memory, wherein the processor is configured to synthesize a three-dimensional (3D) shape by:

processing a text description of the 3D shape by a diffusion neural network model to produce a latent representation; and applying learned parameters to the latent representation, by an implicit decoder neural network, to predict a generative vector field representation of the 3D shape, wherein the generative vector field maps points in 3D space to vectors, such that a closest point on a surface of the 3D shape is intersected by moving from a point of the points along a vector that is mapped to the point.

\*   \*   \*   \*   \*